United States Patent
Iwaki et al.

(10) Patent No.: US 7,498,899 B2
(45) Date of Patent: Mar. 3, 2009

(54) DUPLEXER WITH FILTERS INCLUDING FILM BULK ACOUSTIC RESONATORS

(75) Inventors: Masafumi Iwaki, Kawasaki (JP); Tokihiro Nishihara, Kawasaki (JP); Jun Tsutsumi, Kawasaki (JP); Shinji Taniguchi, Kawasaki (JP); Takeshi Sakashita, Kawasaki (JP); Tsuyoshi Yokoyama, Kawasaki (JP); Masanori Ueda, Yokohama (JP); Tsutomu Miyashita, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 155 days.

(21) Appl. No.: 11/236,861

(22) Filed: Sep. 28, 2005

(65) Prior Publication Data

US 2006/0066419 A1    Mar. 30, 2006

(30) Foreign Application Priority Data

Sep. 28, 2004    (JP)    .............................. 2004-282848

(51) Int. Cl.
*H03H 9/70* (2006.01)
*H03H 9/54* (2006.01)

(52) U.S. Cl. ...................................... 333/133; 333/189
(58) Field of Classification Search .................. 333/133
See application file for complete search history.

(56) References Cited

U.S. PATENT DOCUMENTS 5,589,806 A * 12/1996 Taguchi et al. .............. 333/193
6,262,637 B1 * 7/2001 Bradley et al. .............. 333/133
6,525,624 B1 * 2/2003 Hikita et al. ................. 333/133

(Continued)

FOREIGN PATENT DOCUMENTS

EP    1 418 672 A2    5/2004

(Continued)

OTHER PUBLICATIONS

Yoshio Satoh et al, "*Development of 5GHz FBAR Filters for Wireless Systems*", Second International Symposium on Acoustic Wave Devices for Future Mobile Communication Systems, Mar. 3, 2004, XP002368797, URL:http:// www.usk.chiba-u.ac.jp/{ken/Symp2004/PDF/2C2.PDF>, [retrieved on Feb. 17, 2006] http://www.usl.chiba-u.ac.jp/{ken/Symp2004/PROCS.PDF, Chapters I, IV, VI Figures 6,7, Japan.

*Primary Examiner*—Barbara Summons
(74) *Attorney, Agent, or Firm*—Arent Fox LLP

(57) ABSTRACT

A duplexer includes: first and second filters including film bulk acoustic resonators (FBARs) arranged in a ladder form; first and second integrated-passive devices (IPDs) provided between a common terminal and the first and second filters; and a substrate on which the first and second filters and the first and second IPDs are mounted. The substrate includes conductive patterns that realize inductances connected between the first and second filters and ground. The first and second IPDs includes inductors connected to the first and second filters.

6 Claims, 30 Drawing Sheets

U.S. PATENT DOCUMENTS

| | | | |
|---|---|---|---|
| 6,741,146 B2 * | 5/2004 | Ella | 333/133 |
| 6,759,924 B2 * | 7/2004 | Sakuragawa et al. | 333/133 |
| 6,911,708 B2 * | 6/2005 | Park | 257/416 |
| 6,927,649 B2 * | 8/2005 | Metzger et al. | 333/133 |
| 6,995,497 B2 * | 2/2006 | Inoue | 310/320 |
| 7,034,635 B2 * | 4/2006 | Nakamura et al. | 333/133 |
| 7,053,730 B2 * | 5/2006 | Park et al. | 333/133 |
| 2001/0052831 A1 | 12/2001 | Milsom | |
| 2004/0130410 A1 | 7/2004 | Nishimura et al. | |
| 2005/0073375 A1 * | 4/2005 | Sul et al. | 333/133 |
| 2005/0195047 A1 * | 9/2005 | Park et al. | 333/133 |

FOREIGN PATENT DOCUMENTS

| | | |
|---|---|---|
| JP | 9-98046 A | 4/1997 |
| JP | 2800905 B2 | 7/1998 |
| JP | 2905094 B2 | 3/1999 |
| JP | 2001-127588 A | 5/2001 |
| JP | 3487692 B2 | 10/2003 |

* cited by examiner

SERIES-ARM RESONATOR

PARALLEL-ARM RESONATOR

SERIES-ARM RESONATOR

PARALLEL-ARM RESONATOR

ADDITIONAL INDUCTANCE

SERIES-ARM RESONATOR

ADDITIONAL INDUCTANCE

COVER  FILTER  WIRE  WIRE PAD

CONDUCTIVE PATTERN

INPUT/OUTPUT TERMINAL

INPUT/OUTPUT TERMINAL

CHARACTERISTIC IMPEDANCE Z0 OF PHASE SHIFTER : 45, 50, 55[Ω ]

CHARACTERISTIC IMPEDANCE Z0 OF PHASE SHIFTER : 45, 50, 55[Ω ]

UNIFIED

UNIFIED g>1 IN THE CENTER OF PASS BAND g<1 IN THE CENTER OF PASS BAND

○ 1,2 : MARKER INDICATING END OF PASS BAND

○ 3 : MARKER INDICATING CENTER OF PASS BAND

○ 1,2 : MARKER INDICATING END OF PASS BAND

○ 3 : MARKER INDICATING CENTER OF PASS BAND g>1 IN THE CENTER OF PASS BAND g<1 IN THE CENTER OF PASS BAND

○1,2: MARKER INDICATING END OF PASS BAND
○3: MARKER INDICATING CENTER OF PASS BAND

○1,2: MARKER INDICATING END OF PASS BAND
○3: MARKER INDICATING CENTER OF PASS BAND

DUPLEXER WITH FILTERS INCLUDING FILM BULK ACOUSTIC RESONATORS

BACKGROUND OF THE INVENTION

1. Field of the Invention

This invention generally relates to a filter using a film bulk acoustic resonator (hereinafter referred to as FBAR) used in mobile communications and high-frequency radio frequency communications such as cellular phones, PHS and wireless LAN. More specifically, the present invention relates to a duplexer equipped with a filter composed of multiple FBARs arranged and connected in a ladder form.

2. Description of the Related Art

Recently, there has been considerable activity in the development of filter elements used for high frequency communications and capable of allowing electric signals in a specific frequency range to pass by the combination of SAW or BAW resonators having a piezoelectric material (SAW is an abbreviation of surface acoustic wave, and BAW is an abbreviation of bulk acoustic wave). The filter devices that utilize SAW or BAW have a small outer size and a sharp roll-off characteristic, as compared to dielectric filters or ceramic filters, and are thus suitable for components for mobile communications such as portable phones, which are required to have a compact size and a wide comparative bandwidth. The SAW or BAW filter as described above may be typically a ladder-type filter in which resonators are arranged and connected in a ladder form. An exemplary ladder-type filter is illustrated in FIG. 1.

As is well known, the insertion loss and the out-of-band attenuation of the ladder-type filter can easily be controlled by simply changing the number of stages of the ladder form and the capacitance ratio of resonators in series and parallel arms. Further, the design sequence of the ladder-type filter is simple. From these viewpoints, the ladder-type filter is widely used. Japanese Patent No. 2800905 (Document 1) discloses a method of more flexibly changing the performance of the ladder-type filter. This method adds an inductance to a resonator in parallel or series. In the practical use of SAW or BAW, the inductance is implemented by a conductive pattern on an exposed or inner surface of a multilayered substrate or a wire. FIGS. 2 and 3 are equivalent circuits of filters having an additional inductance described above.

A duplexer is an applied component of the ladder-type filter of SAW or BAW. The duplexer is used for a communication apparatus having the functions of simultaneously sending and receiving signals at different frequencies, such as a CDMA system. The duplexer functions to suppress interference between the transmitted and received signals and allow only signals in a required frequency range to pass therethrough. Generally, the duplexer has an arrangement such that a transmit filter, a receive filter and a phase matching circuit are integrated into a single component. The transmit and receive filters are used as band-pass filters that allow the respective signals to pass therethrough, and are connected to an antenna. In this case, the transmitted and received signals may be interfered. The phase shifter, which functions as a phase matching circuit, is used to cope with the interference. The phase shifter is an electrical element having a combination of an inductance and a capacitance in the equivalent circuit. Japanese Patent No. 2905094 (Document 2) discloses a duplexer using SAW or BAW in which a distributed-constant line of a conductive pattern formed in a multilayered substrate is used as a phase shifter, as shown in FIG. 4. Japanese Patent No. 3487692 (Document 3) or Japanese Patent Application Publication No. 2001-127588 (Document 4) discloses a combination of inductance and capacitance elements of the lumped parameter type such as a wound coil, chip inductor and a chip capacitor, which may be used along with a substrate or cap.

However, the conventional techniques have the following problems. As described in Document 3, the method disclosed in Document 1 uses the conductive pattern for the phase line, which occupies a two- or three-dimensional space. For example, a duplexer for the WCDMA band in a frequency range of 2 GHz requires two conductive patterns which are 0.6 mm thick and 25 mm long in order to shift the phases of the transmit and receive filters by 180 degrees with a conductive pattern that is made of alumina having a dielectric constant of 9.5 and a width of 0.1 mm and has a characteristic impedance of 50 Ω. As has been described, the additional inductance is generally used to improve the performance of the ladder-type filter. When the additional inductance is implemented by a conductive pattern, it is necessary to separate the conductive patterns from each other at a sufficient distance because a close arrangement of the conductive patterns results in coupling of the inductances and degrades the desired filter characteristics. However, the separate arrangement of the conductive patterns does not realize compact packaging of the duplexer.

The technique of realizing the phase shifter with inductance and capacitance of the lumped parameter type as described in Documents 2 and 3 may realize the compact phase shifter as compared to the phase shifter with the conductive patterns if the chip inductor, wound coil and/or chip capacitor are used as discussed in Documents 2 and 3. However, even when the 1005-size multi-purpose chip components (1.0×0.5×0.5 [mm]) that are currently available are used, the package has a size as large as 8×5.1×2.5 [mm] as described in Document 2. It cannot be said that the above size is small because the duplexers of 5 mm□ or 8 mm□ are currently available. In addition, the number of chips increases by the number of passive components, and the production cost increases.

SUMMARY OF THE INVENTION

The present invention has been made in view of the above circumstances and provides a compact duplexer having improved characteristics.

According to an aspect of the present invention, there is provided a duplexer including: first and second filters including film bulk acoustic resonators (FBARs) arranged in a ladder form; first and second integrated-passive devices (IPDs) provided between a common terminal and the first and second filters; and a substrate on which the first and second filters and the first and second IPDs are mounted, the substrate including conductive patterns that realize inductances connected between the first and second filters and ground, the first and second IPDs including inductors connected to the first and second filters.

According to another aspect of the present invention, there is provided a duplexer including: first and second filters including film bulk acoustic resonators (FBARs) arranged in a ladder form; first and second phase matching circuits (IPDs) provided between a common terminal and the first and second filters; and an inductor included in at least one of the first and second phase matching circuits and connected to a ground and the common terminal, wherein $Cp \times Cs < 1/(R \times 2\pi f_0)^2$ is satisfied where Cp and Cs are capacitances of a series-arm resonator and a parallel-arm resonator of one of the first and second filters that are associated with said at least one of the first and second phase matching circuits and are closet thereto, R is a termination resistance of the duplexer, and $f_0$ is a center frequency of said one of the first and second filters.

According to yet another aspect of the present invention, there is provided a duplexer including: first and second filters including film bulk acoustic resonators (FBARs) arranged in a ladder form; first and second phase matching circuits (IPDs) provided between a common terminal and the first and second filters; and an inductor included in at least one of the first and second phase matching circuits and connected to a ground and the common terminal, wherein an area of a membrane region of a series-arm resonator of one of the first and second filters that is associated with said at least one of the first and second phase matching circuits and is closest thereto is smaller than areas of membrane regions of other series-arm resonators.

BRIEF DESCRIPTION OF THE DRAWINGS

Other objects, features and advantages of the present invention will become more apparent from the following detailed description when read in conjunction with the accompanying drawings, in which:

FIGS. 22A through 22D show lumped parameter type elements, wherein FIG. 22A shows a n-type L-C-L circuit, FIG. 22B shows a T-type C-L-C circuit, FIG. 22C shows a T-type L-C-L circuit, and FIG. 22D shows a n-type C-L-C circuit;

FIGS. 25A through 25F show lumped parameter type elements, wherein FIG. 25A shows a capacitor and an inductor connected in series and parallel, respectively, FIG. 25B shows an inductor and capacitor connected in series and parallel, respectively, FIG. 25C shows an inductor connected in parallel; FIG. 25D shows a capacitor connected in parallel; FIG. 25E shows an inductor connected in series, and FIG. 25F shows a capacitor connected in series;

DESCRIPTION OF THE PREFERRED EMBODIMENTS

A description will now be given, with reference to the accompanying drawings, of embodiments of the present invention.

First Embodiment

Figure 1:
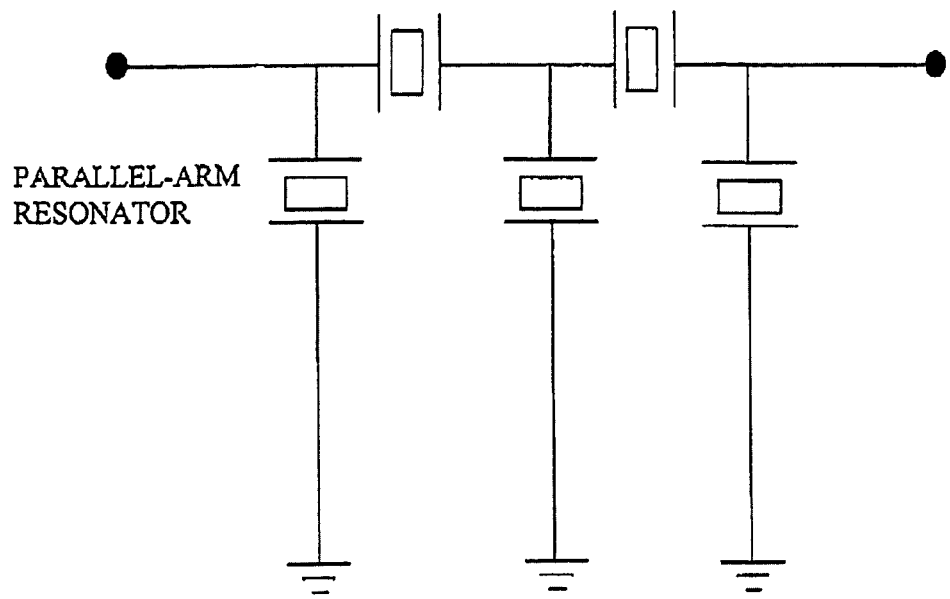
FIG. 1 is a circuit diagram of a ladder-type filter.
Figure 2:
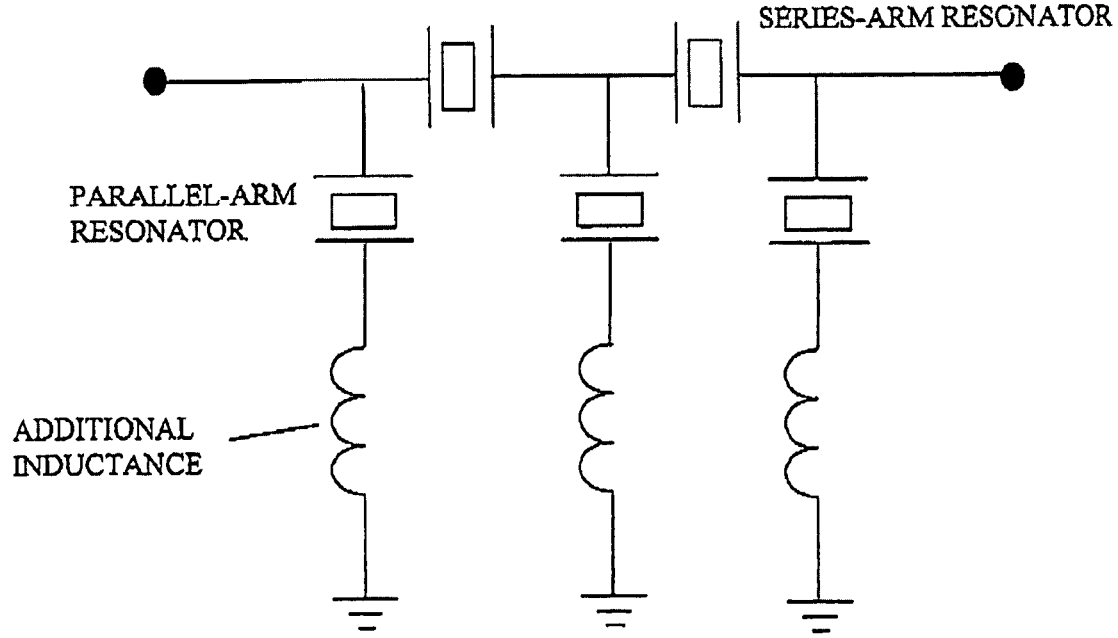
FIG. 2 shows a circuit in which additional inductances are applied to the ladder-type filter shown in FIG. 1.
Figure 3:
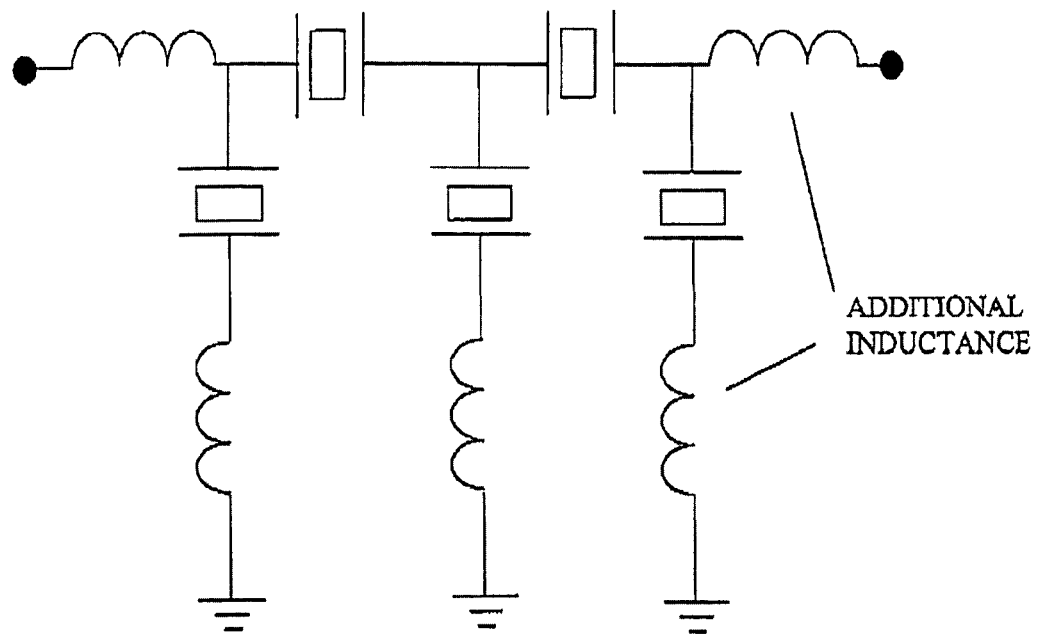
FIG. 3 shows a circuit in which additional inductances are applied to the ladder-type filter shown in FIG. 2.
Figure 4:
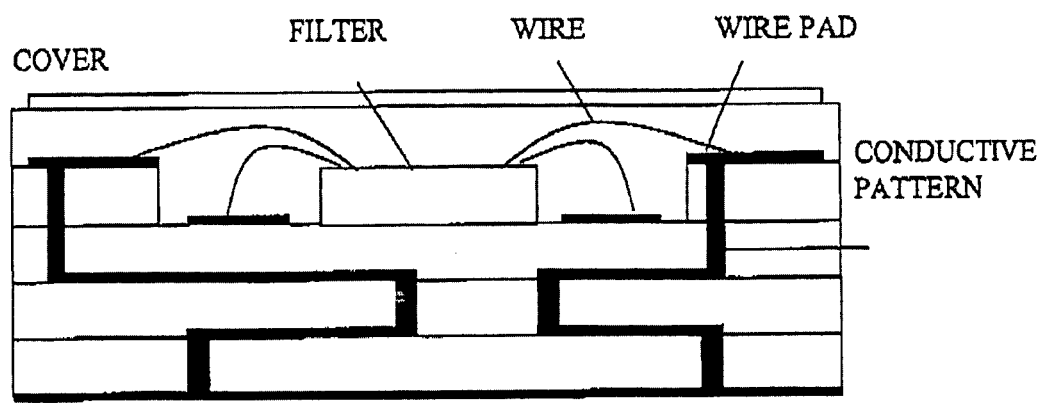
FIG. 4 shows a duplexer proposed in Document 2.
Figure 5:
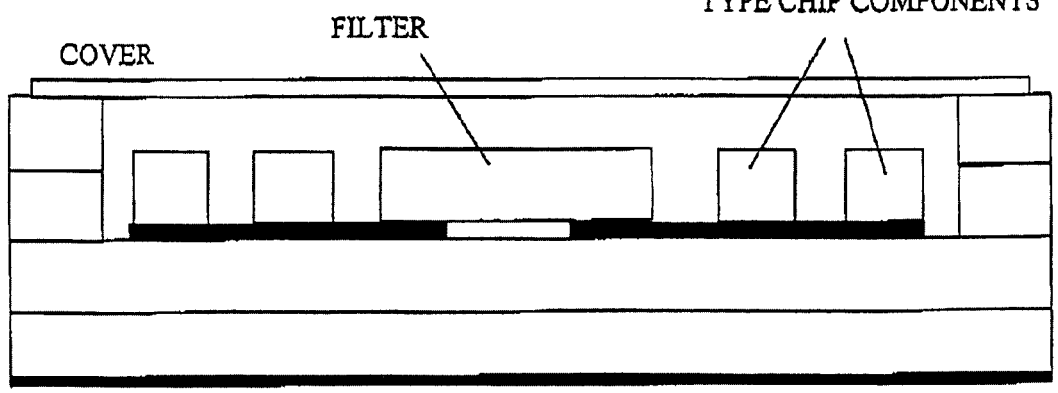
FIG. 5 shows a duplexer proposed in Documents 3 and 4.
Figure 6:
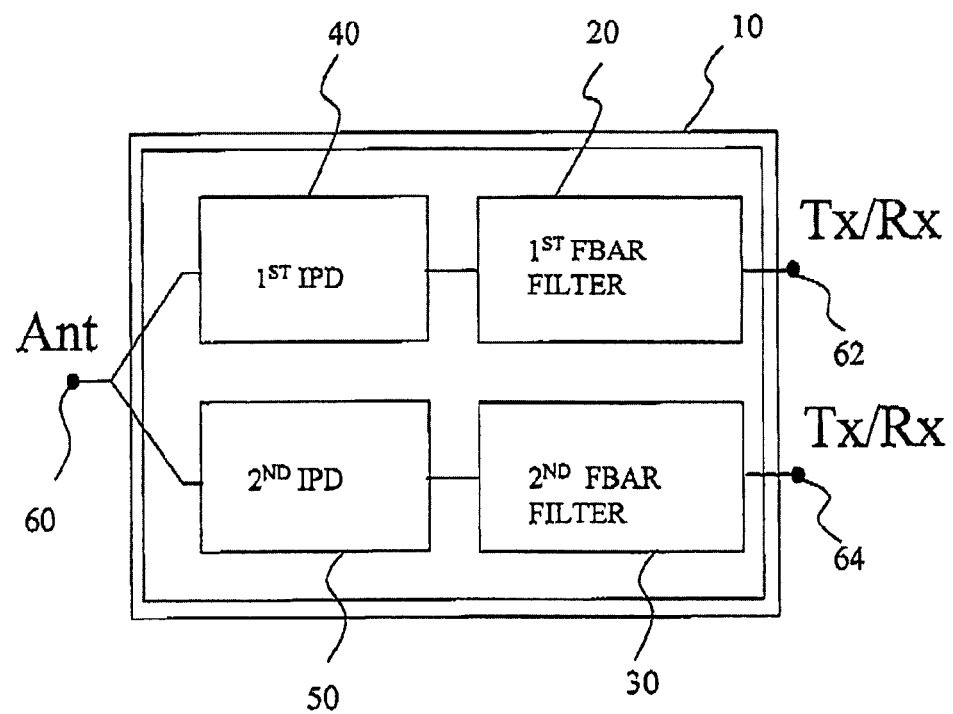
FIG. 6 is a block diagram of a fundamental structure of a duplexer according to a first embodiment of the present invention.

FIG. 6 shows the fundamental structure of a duplexer according to an embodiment of the present invention. The duplexer has a first FBAR filter 20, a second FBAR filter 30, a first integrated-passive device (hereinafter simply referred to as IPD) 40, and a second IPD 50. These structural elements are sealed within a package 10. An antennal terminal 60 and transmit/receive terminals (Tx/Rx) 62 and 64 are attached to the package 10. In a case where the first FBAR filter 20 and the second FBAR filter 30 are a transmit filter and a receive filter, respectively, the terminals 62 and 64 are a transmit terminal and a receive terminal, respectively. The first IPD 40 is provided between the antenna terminal 60 and the first FBAR filter 20. Similarly, the second IPD 50 is provided between the antenna terminal 60 and the second FBAR filter 30. As will be described in detail later, the package 10 has electrically conductive patterns, which realize an inductance between the first FBAR filter 20 and the ground, and an inductor between the second FBAR filter 30 and the ground. Each of the first and second IPDs 40 and 50 has respective inductors. The present duplexer has an arrangement in which the inductances necessary for the duplexer are implemented by a distributed arrangement of the inductors provided on the package 10 and the inductors provided in the first and second IPDs 40 and 50. This arrangement realizes a compact duplexer having high filter performance.

Figure 7A:
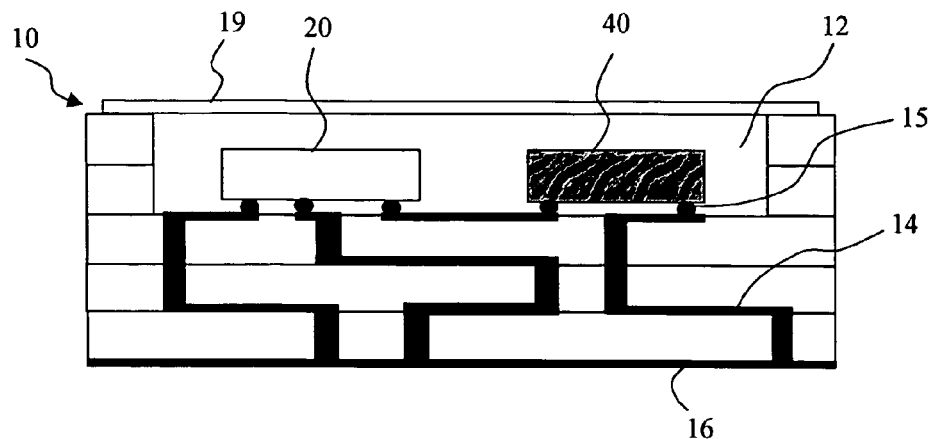
FIGS. 7A and 7B are cross-sectional and plan views of the duplexer shown in FIG. 6.
Figure 7B:
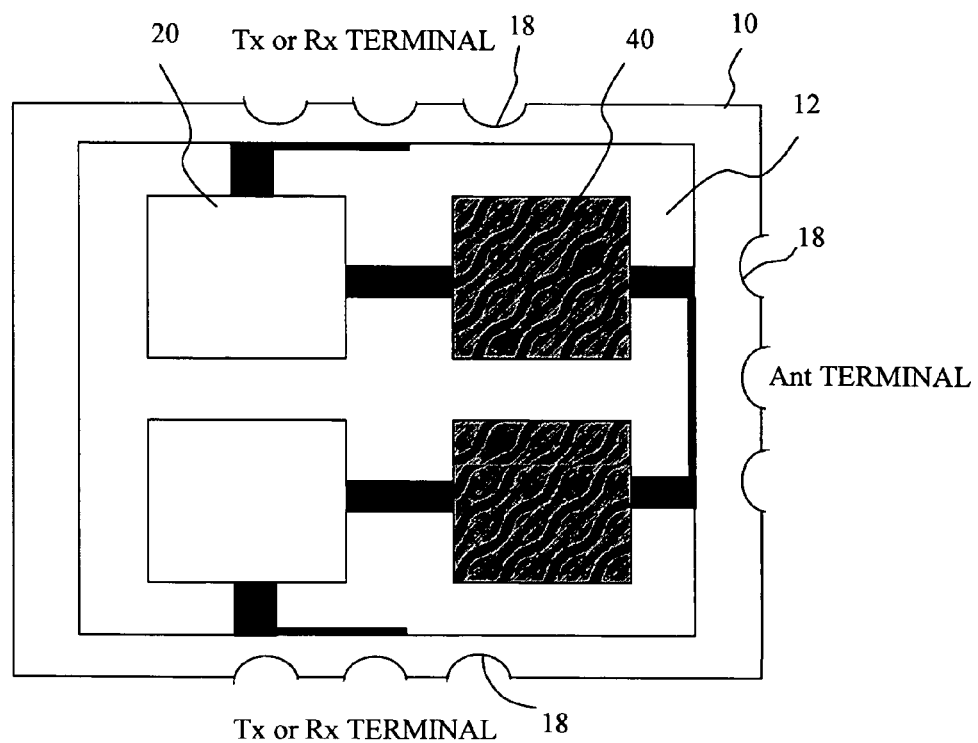

FIG. 7A is a cross-sectional view of the duplexer shown in FIG. 6, and FIG. 7 is a plan view thereof. The cross-sectional view of FIG. 7A is taken along a line passing over the first FBAR filter 20 and the first IPD 40 in FIG. 7B. The package 10 has a multilayer structure composed of multiple layers that are laminated and made of, for example, ceramics. The multilayer structure is referred to as a base substrate. The package 10 has a cavity 12, in which the first and second FBAR filters 20 and 30 and the first and second IPDs 40 and 50 are housed. These components are flip-chip bonded, by bumps 15, to interconnection patterns formed on the bottom surface of the cavity 12. Electrically conductive patterns 14 are provided in and on the package 10. The conductive patterns 14 make connections between components in the package 10 such as a connection between the first IPD 40 and the first FBAR filter 20, a connection between the second IPD 50 and the second FBAR filter 30. The conductive patterns 14 also function to realize inductances connected between the first FBAR filter 20 and the ground and between the second FBAR filter 30 and the ground. Footpads 16 are provided on the back surface of the package 10. The footpads 16 are patterned signal and ground terminals made of an electrically conductive substance provided on the bottom of the package 10. Castellations 18 are formed on side surfaces of the package 10. The castellations 18 are electrically conductive paths composed of grooves formed on the side surfaces of the package 10 and an electrically conductive substance provided in the grooves. Although omitted in FIGS. 7A and 7B for the sake of convenience, the conductive patterns 14 function to make electrical connections between the layers of the package 10 and function as the terminals 60, 62 and 64 shown in FIG. 6 in which the patterns 14 are connected to the footpads 16 on the backside of the package 10. In the structure shown in FIGS. 7A and 7B, the castellations 18 are formed on the three outer surfaces of the package 10. However, the arrangement of the castellations 18 are not limited to the outer surfaces or three outer surfaces. A cover 19 is provided on the top of the package 10 so that the elements in the cavity 12 are hermetically sealed.

Figure 8A:
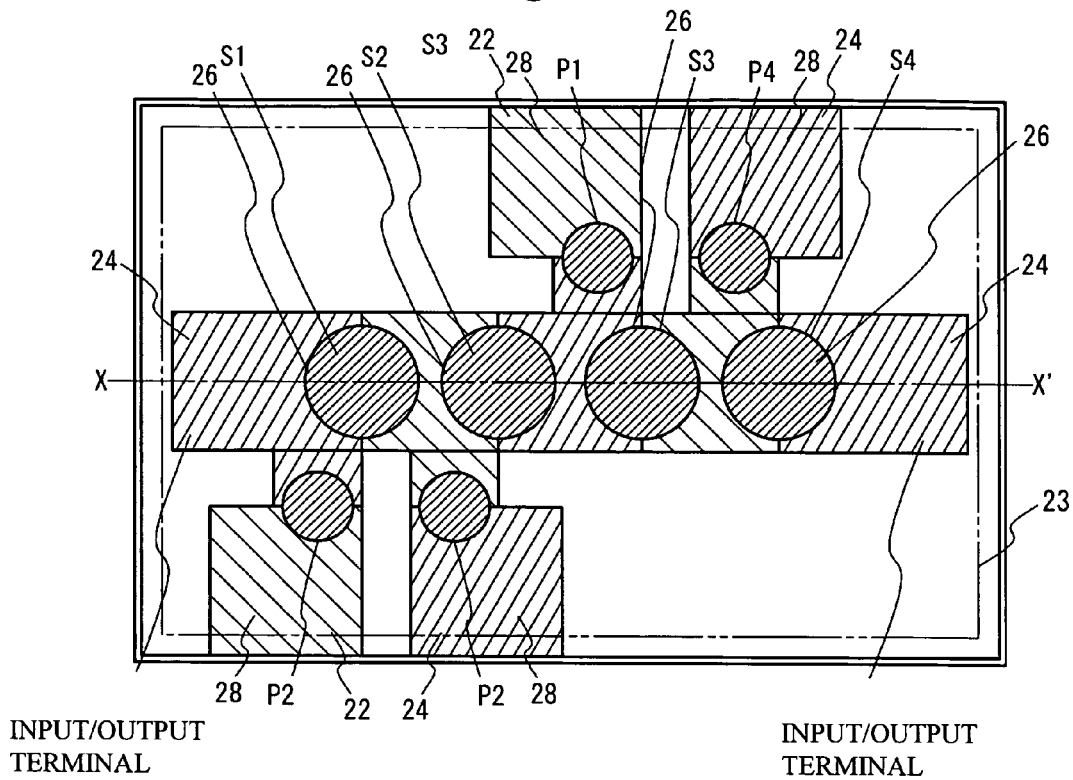
FIGS. 8A and 8B are plan and cross-sectional views of a first FBAR filter shown in FIG. 6.
Figure 8B:
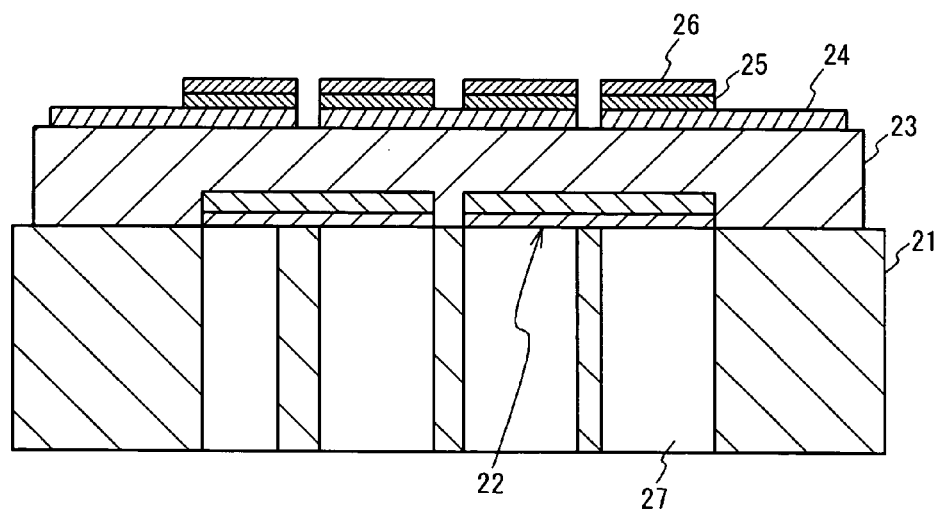

FIGS. 8A and 8B show a structure of the first and second FBAR filters 20 and 30. More specifically, FIG. 8A is a plan view of the FBAR filters 20 and 30, and FIG. 8B is a cross-sectional view taken along a line X-X' shown in FIG. 8A. In the following direction, it is assumed that FIGS. 8A and 8B show the structure of the first FBAR filter 20. The first FBAR filter 20 has multiple FBARs. Each of the FBARs has a common substrate 21 made of silicon or glass on which a laminate structure is formed. The laminate structure is composed of an upper electrode film 24, a piezoelectric film 23, and a lower electrode film 22. A cavity 27 provided for each FBAR is formed in the substrate 21 and is located just below the upper electrode film 22 opposite to the upper electrode film 24. Elastic energy is confined in the cavity 27. The lower electrode film 22 may have a double-layer structure. One of the two layers of the lower electrode film 22 faces the cavity 27 and may be a Cr film, and the other is provided on the lower layer and may be a Ru film. The upper electrode film 24 has two adjustment layers for adjusting the center frequency of the first FBAR filter 20. The first FBAR filter 20 has four series-arm resonators S1-S4 and parallel-arm resonators P1-P4. The parallel-arm resonators P1-P4 are connected to ground patterns 28 formed on the dielectric film 23. Opposing ends of the upper electrode film 24 may be used as input/output terminals.

Figure 9:
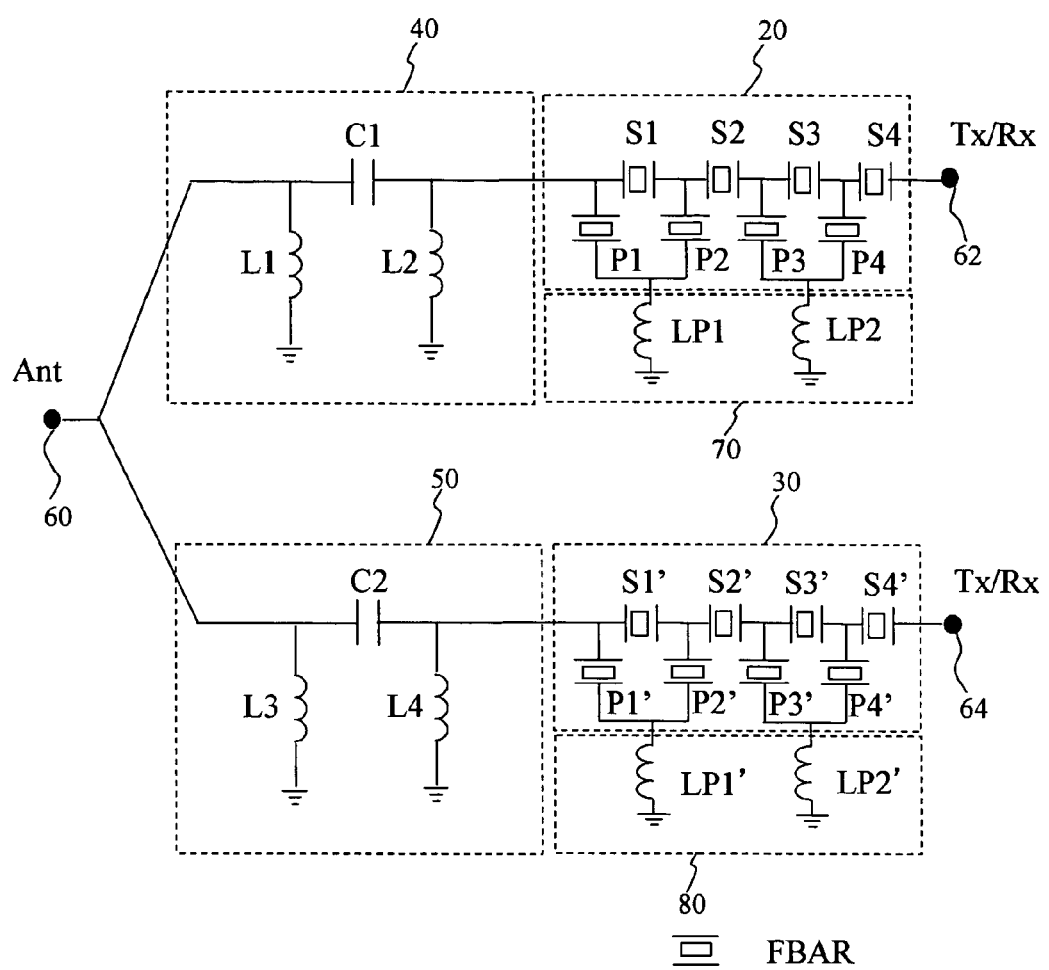
FIG. 9 is a circuit diagram of the duplexer according to the first embodiment of the present invention.

The duplexer including the first FBAR filter 20 thus structured has an electrically equivalent circuit shown in FIG. 9. An additional inductor LP1 is provided between the parallel-arm resonators P1 and P2 and the ground, and an additional inductor LP2 is provided between the parallel-arm resonators P3 and P4 and the ground. The additional inductors LP1 and LP2 are collectively referred to as an additional inductance circuit 70. The use of the additional inductors LP1 and LP2 makes it possible to adjust the passband range of the first FBAR filter 20. The additional inductors LP1 and LP2 are formed by the conductive patterns 14 shown in FIG. 7A. The second FBAR filter 30 is formed in the same manner as the first FBAR filter 20. The second FBAR filter 30 has four series-arm resonators S1'-S4', four parallel-arm resonators P1'-P4', and an additional inductance circuit 80 composed of additional inductors LP1' and LP2'.

The first IPD 40 has inductors L1 and L2 and a capacitor C1, these components being of the lumped parameter circuit type, and functions as a filter (n type high-pass filter in FIG. 9). Similarly, the second IPD 50 has inductors L3, L4 and a capacitor C2 of the lumped parameter circuit type, and functions as a filter (n type high-pass filter in FIG. 9). The first and second IPDs 40 and 50 function to adjust the phases of the signals passing through the first and second FBAR filters 20 and 30 in order to prevent interference therebetween.

Figure 10:
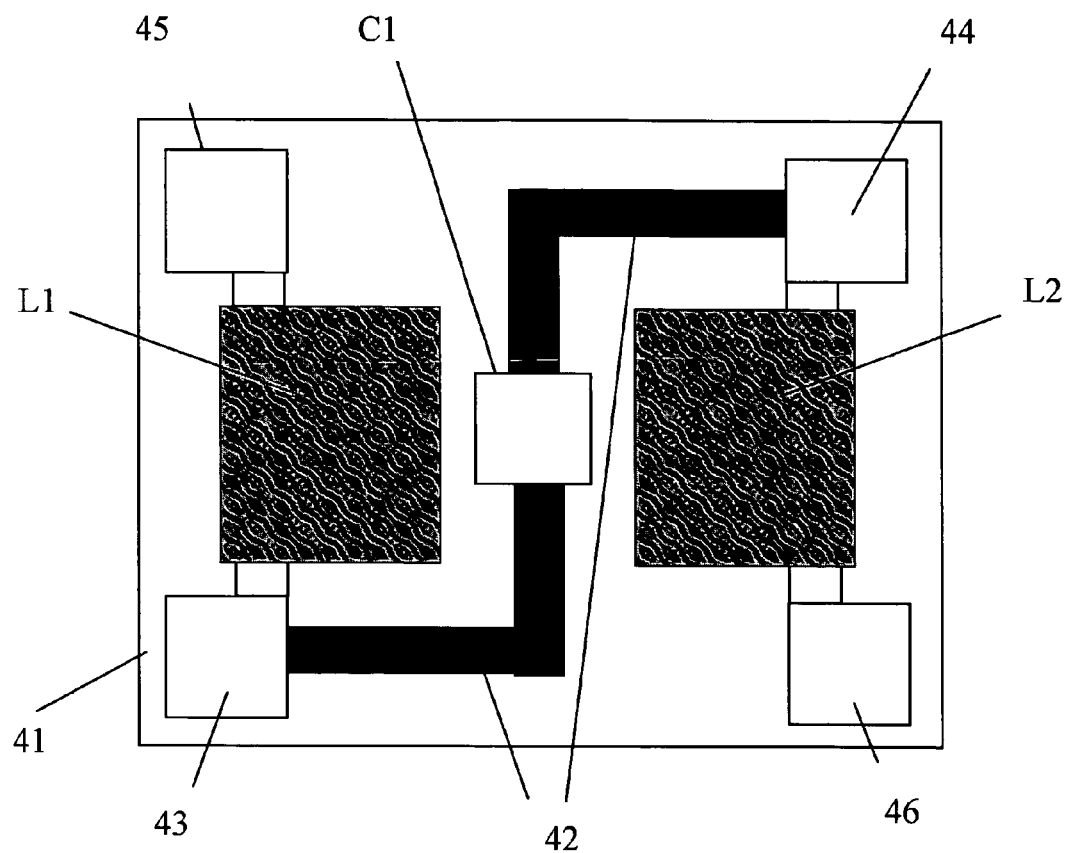
FIG. 10 is a plan view of the first IPD employed in the first embodiment of the present invention.

FIG. 10 shows an exemplary structure of the first and second IPDs 40 and 50. In the following description, it is assumed that FIG. 10 shows the structure of the first IPD 40. The first IPD 40 has a support substrate 41, on which provided are the first inductor L2, the second inductor L2, the capacitor C1, signal lines 42, two signal terminals 43 and 44, and two ground terminals 45 and 46. The capacitor C1 is placed in the center of the support substrate 41, and the inductors L1 and L2 are arranged so as to interpose the capacitor C1. The signal terminals 43 and 44 are diagonally arranged on the support substrate 41, and are connected to the capacitor C1 via the signal lines 42. The diagonal arrangement of the signal terminals 43 and 44 makes it possible to bypass the inductors L1 and L2 that occupies the chip area greatly and to connect the signal terminals 43 and 44 to the capacitor C1 at the minimum distance. The ground terminals 45 and 46 have another diagonal arrangement. The second IPD 50 has a structure similar to that of the first IPD 40.

The duplexer of the present embodiment has the unique structure in which the inductances necessary for the duplexer are implemented by a distributed arrangement of the additional inductors provided LP1, LP2, LP1' and LP2' on the package 10 and the inductors L1 and L2 provided in the first and second IPDs 40 and 50. This arrangement realizes a compact duplexer having high filter performance.

Figure 11A:
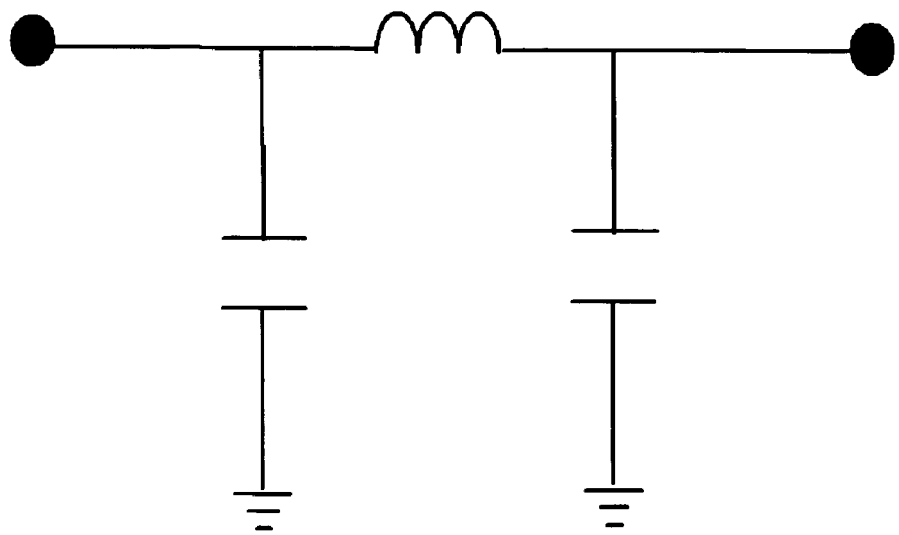
FIGS. 11A and 11B show filters implemented by first and second IPDs employed in the first embodiment of the present invention.
Figure 11B:
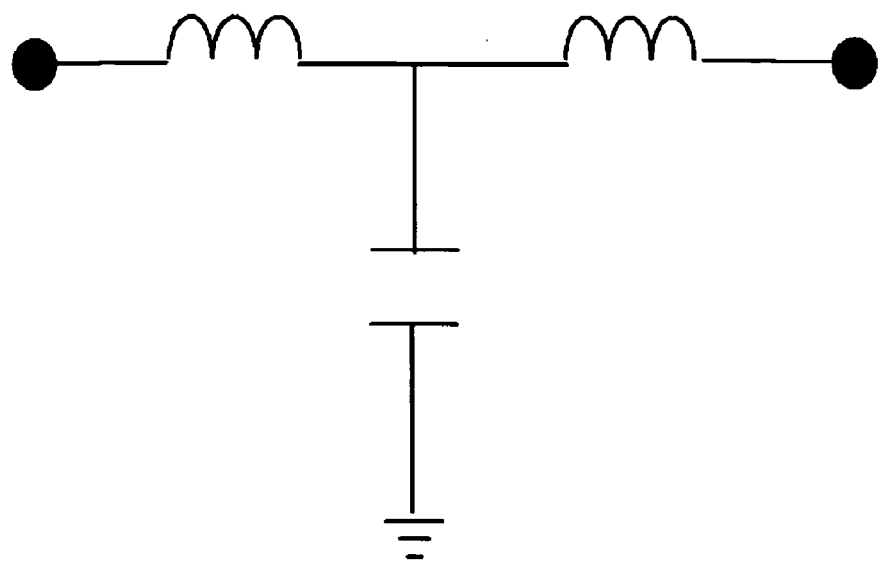

Preferably, the first and second IPDs 40 and 50 are the high-pass filters, as mentioned before. The first and second IPDs 40 and 50 may be low-pass filters shown in FIG. 11A or low-pass filters shown in FIG. 11B. It is to be noted that the present inventors found out that the use of high-pass filters bring about particular advantages.

Figure 12A:
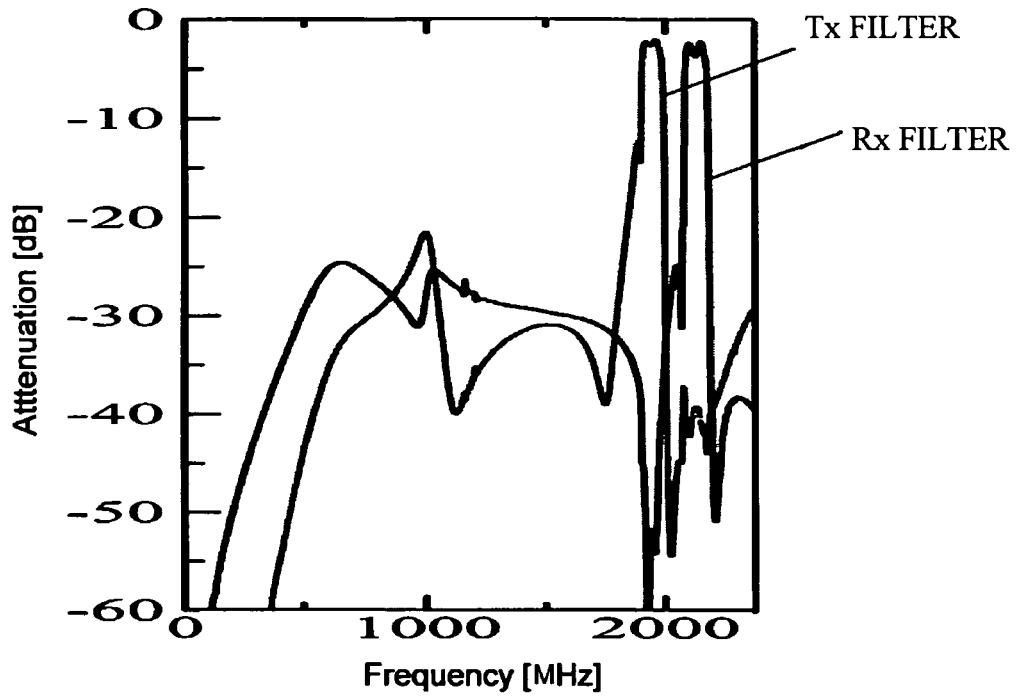
FIG. 12A is a graph of the frequency characteristic of a duplexer equipped with a low-pass filter.
Figure 12B:
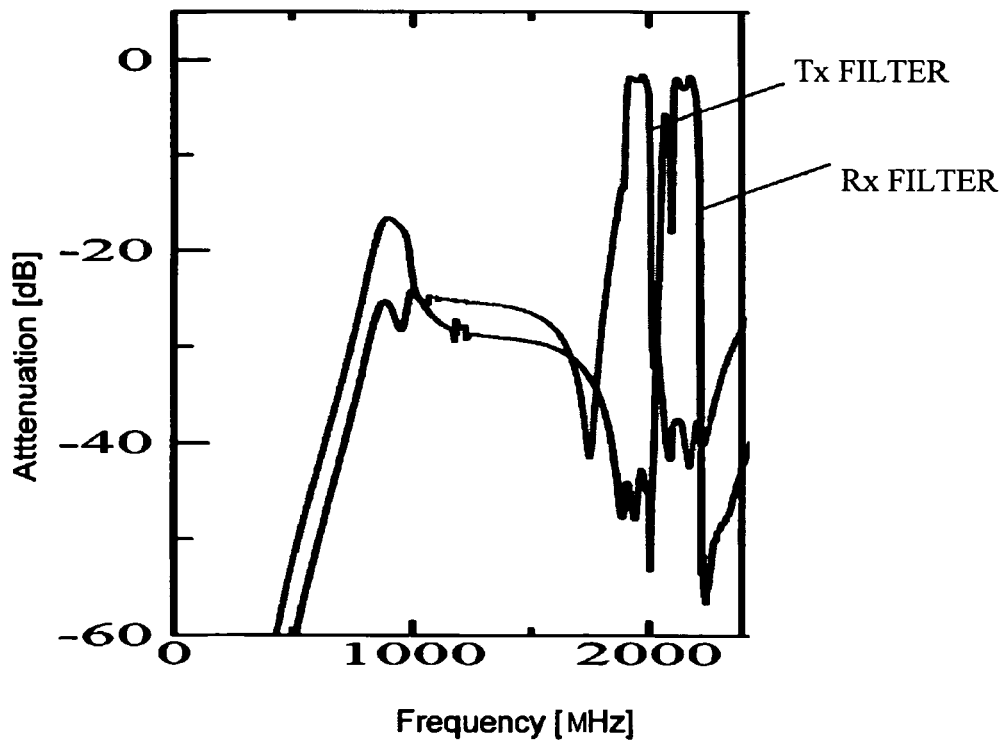
FIG. 12B is a graph of the frequency characteristic of a duplexer equipped with a high-pass filter.

FIG. 12A shows a band-pass characteristic of a duplexer with a phase shifter formed by a low-pass filter, and FIG. 12B shows a band-pass characteristic of a duplexer with a phase shifter formed by a high-pass filter. The frequency characteristics of FIGS. 12A and 12B were obtained by experiments conducted by the inventors. It can be seen from these figures that the degree of suppression in the frequency range equal to or lower than approximately 500 [MHz] obtained by the use of the high-pass filter is superior to that obtained by the low-pass filter. The pass bands of the first and second filters 20 and 30 are close to each other and the rising end of one of the pass bands and the falling end of the other pass band partially overlap with each other.

Figure 13A:
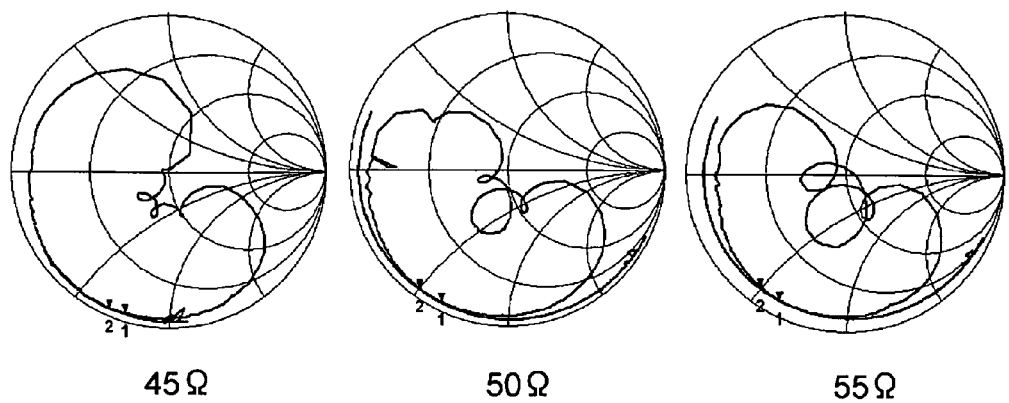
FIG. 13A is a Smith chart of the reflection characteristic of the duplexer equipped with the low-pass filter.
Figure 13B:
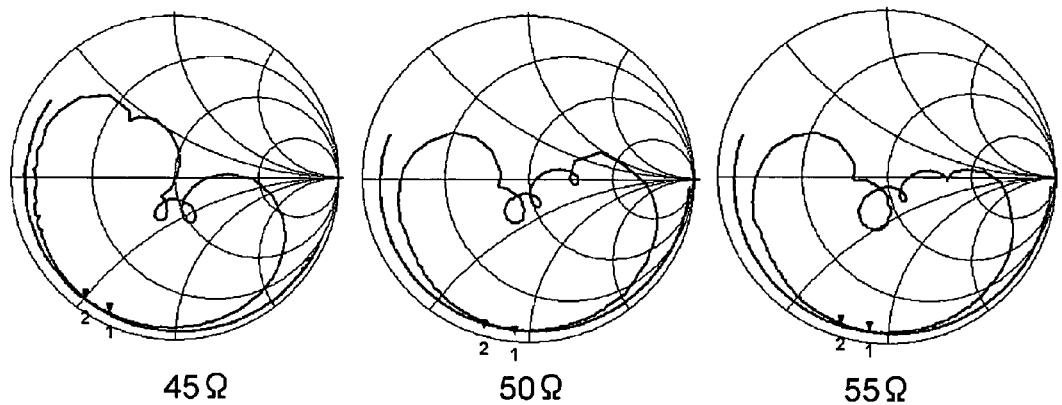
FIG. 13B is a Smith chart of the reflection characteristic of the duplexer equipped with the high-pass filter.

FIG. 13A shows the reflection characteristic of a transmit (Tx) filter in which the phase shifter is formed by a low-pass filter, and FIG. 13B shows the reflection characteristic of a transmit filter in which the phase shifter is formed by a high-pass filter. These reflection characteristics were obtained by experiments conducted by the inventors. Generally, it is known that the phase of the filter used in the duplexer has a smaller insertion loss as the characteristic impedance becomes higher and enables higher duplexer performance. It is desired to employ the phase shifter having characteristic impedance as high as possible within the range in which the matching in the pass band is kept. It can be seen from FIG. 13B that the use of the high-pass filter does not degrade the matching in the vicinity of the center (50 [Ω]) of the Smith chart. The use of the high-pass filter realizes the duplexer having superior insertion loss.

It can be seen from FIGS. 12B and 13B that the use of the first and second IPDs 40 and 50 formed by the high-pass filters realizes great attenuation performance at the lower side of the pass band, and good matching and low insertion loss within the pass band in addition of the function of phase matching.

Figure 14:
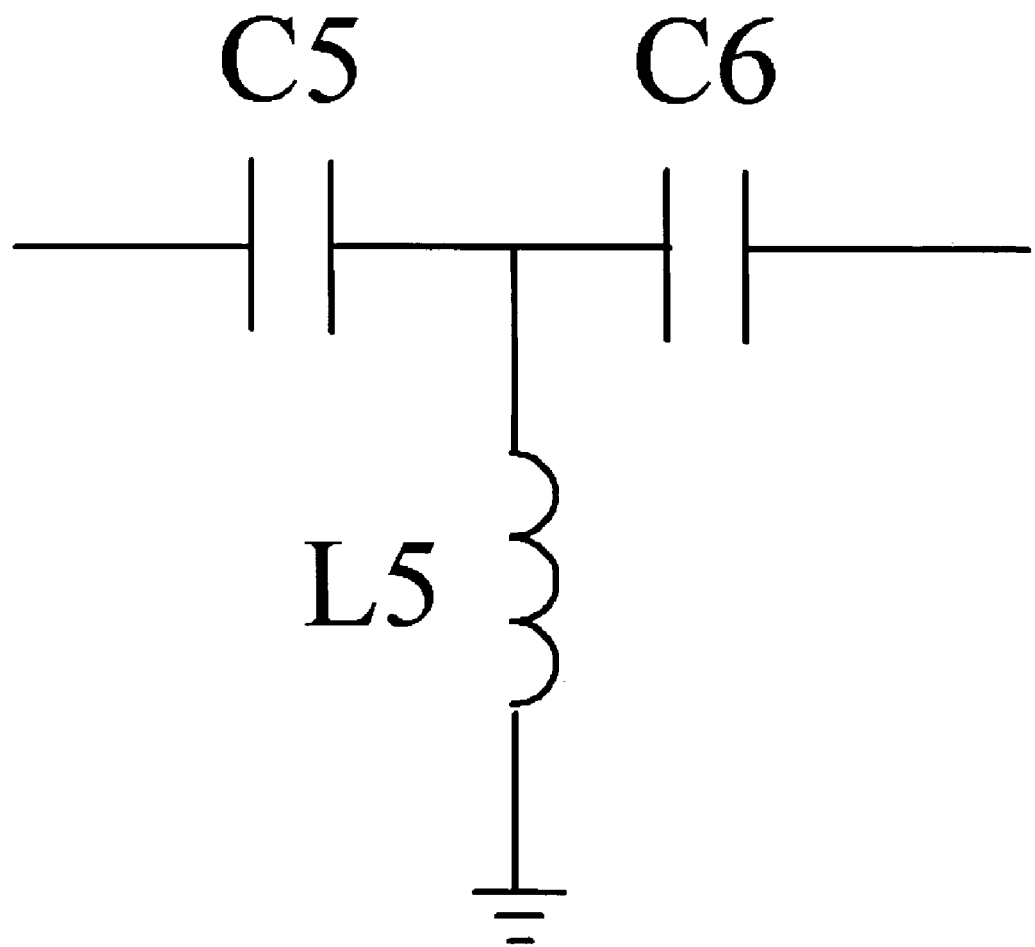
FIG. 14 is a circuit diagram of another exemplary structure of the high-pass filter that may be used in the first and second IPDs.

The high-pass filters formed by the first and second IPDs 40 and 50 are not limited to the circuit configuration shown in FIG. 9, but may be a T-type high-pass filter composed of two capacitors C5 and C6 and an inductor L5 as shown in FIG. 14.

There are two types of high-pass filters as described before, and two termination methods are available for each of the two types. The termination means that the output of the high-pass filter is followed by the series-arm resonator of the FBAR filter or the parallel-arm resonator thereof. It is now assumed that the center frequency of the second FBAR filter 30 is higher than that of the first FBAR filter 20. Generally, the duplexer having the above relationship has the second FBAR filter 30 serving as the receive filter, and the first FBAR filter 20 serving as the transmit filter. Preferably, the second FBAR filter having a higher center frequency terminates the second IPD of the previous stage with the series-arm resonator. This termination is easier than that with the parallel-arm resonator.

Figure 15:
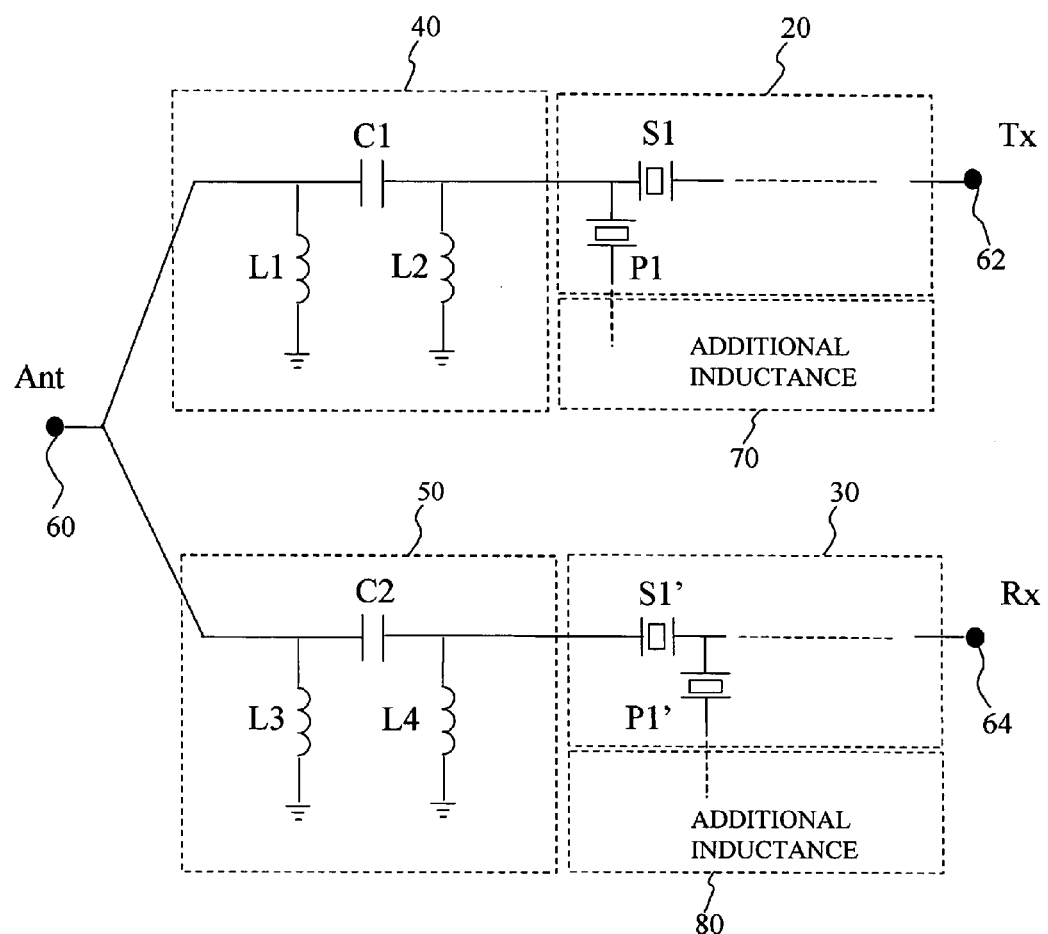
FIG. 15 shows circuit configurations of the first and second IPDs and a structure of terminating these IPDs.

A description will now be given, with reference to FIGS. 15 through 18, of the termination under the above assumption. FIG. 15 shows an embodiment in which the second IPD (n-type filter) 50 is terminated by the series-arm resonator S1' of the second FBAR filter 30, while the first IPD (n-type filter) 40 is terminated by the parallel-arm resonator P1 of the first FBAR filter 20.

Figure 16:
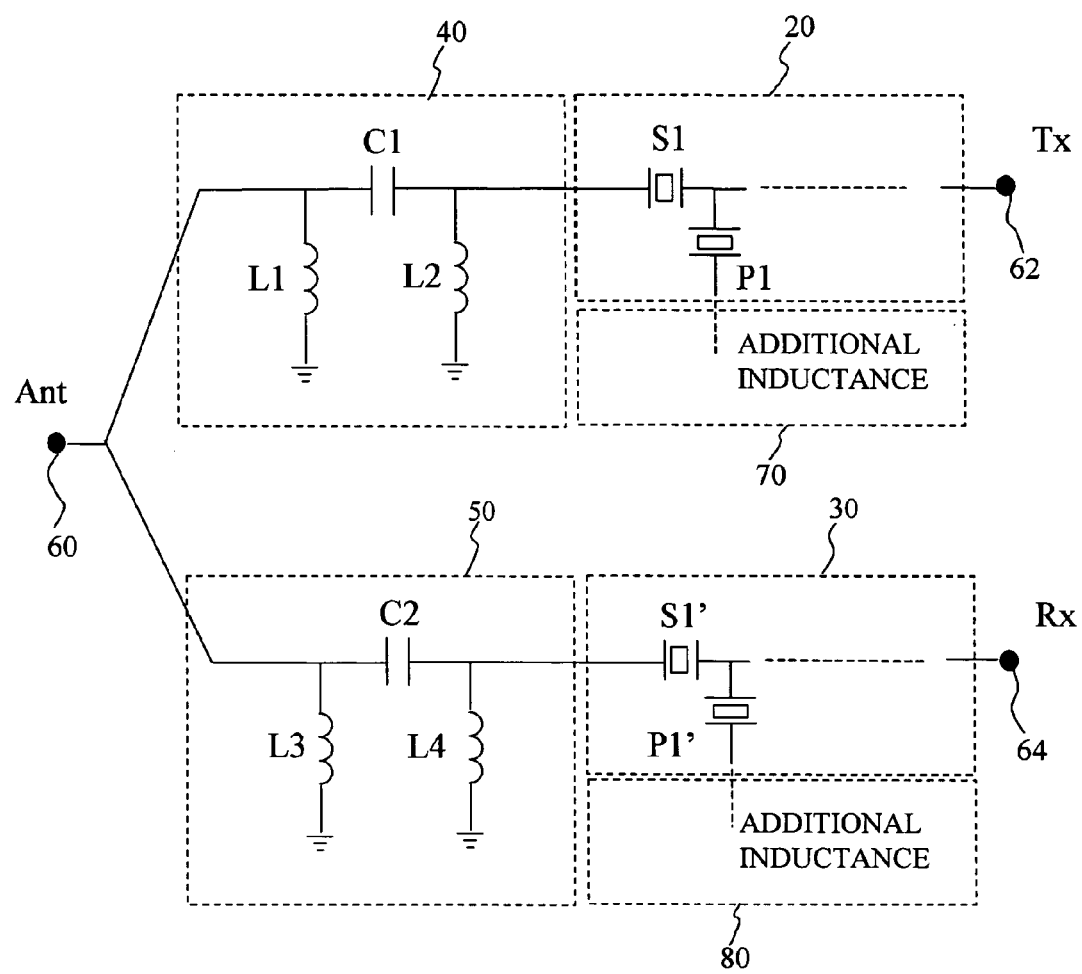
FIG. 16 shows circuit configurations of the first and second IPDs and a structure of terminating these IPDs.

FIG. 16 shows an embodiment in which the second IPD (n-type filter) 50 is terminated by the series-arm resonator S1' of the second FBAR filter 30, while the first IPD (n-type filter) 40 is terminated by the series-arm resonator S1 of the first FBAR filter 20.

Figure 17:
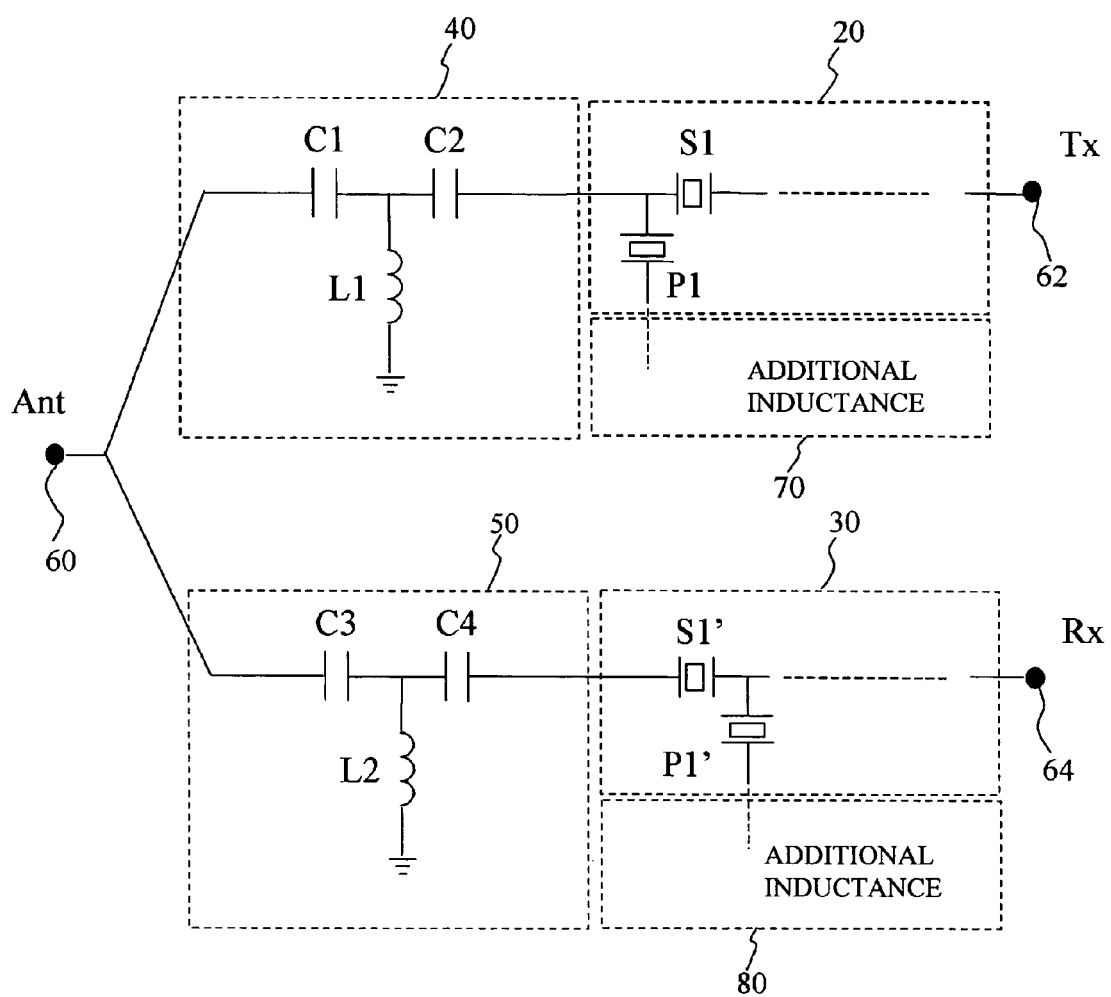
FIG. 17 shows circuit configurations of the first and second IPDs and a structure of terminating these IPDs.

FIG. 17 shows an embodiment in which the second IPD (T-type filter) 50 is terminated by the series-arm resonator S1' of the second FBAR filter 30, while the first IPD (T-type filter) 40 is terminated by the series-arm resonator S1 of the first FBAR filter 20.

In these embodiments, the second IPD 50 is terminated by the parallel-arm resonator P1 of the second FBAR filter 30 having a higher center frequency, while the first IPD 40 is terminated by either the series-arm resonator S1 or the parallel-arm resonator P1 of the first FBAR filter having a lower center frequency.

Figure 19:
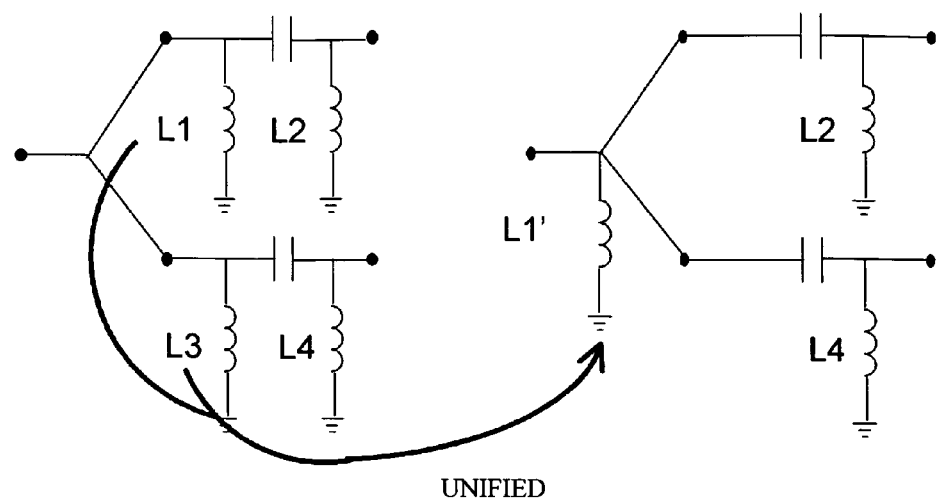
FIG. 19 shows a variation of the configurations shown in FIGS. 15 and 16.

In the structures shown in FIGS. 15 and 16, the inductors L1 and L3 of the first IPD 40 and the second IPD 50 may be formed by a common inductor L1' as shown in FIG. 19. The use of the common inductor L1' contributes to downsizing of the first and second IPDs 40 and 50.

Figure 20:
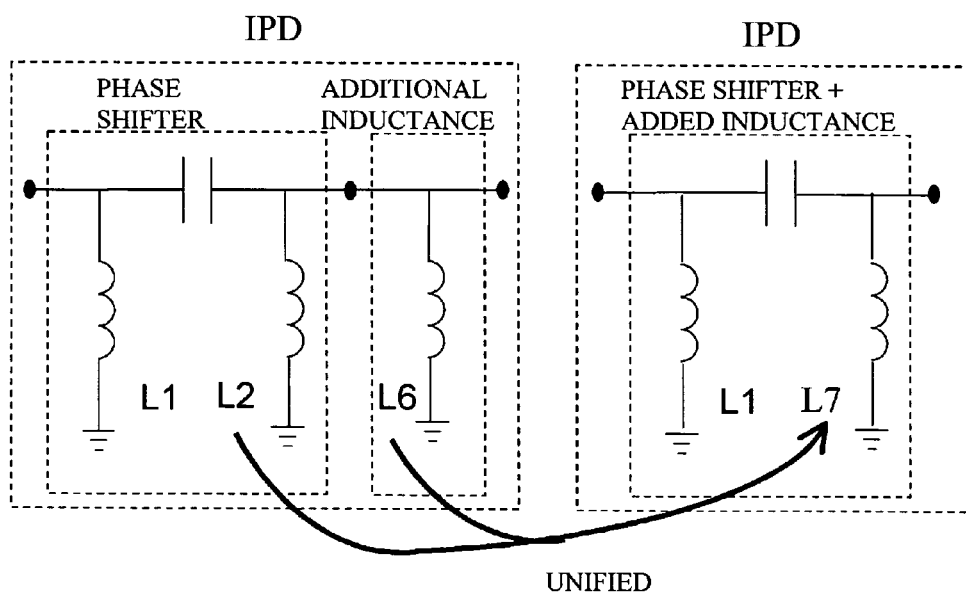
FIG. 20 shows an arrangement in which inductances are added to the first and second IPDs.

As shown in FIG. 20, it is possible to provide an additional inductor L6 to the output of the high-pass filter functioning as a phase shifter, so that the matching can be further improved. In this case, the inductor L2 and additional inductor L6 of the phase shifter may be unified to an inductor L7. Thus, the duplexer can be formed by a reduced number of components.

Figure 21A:
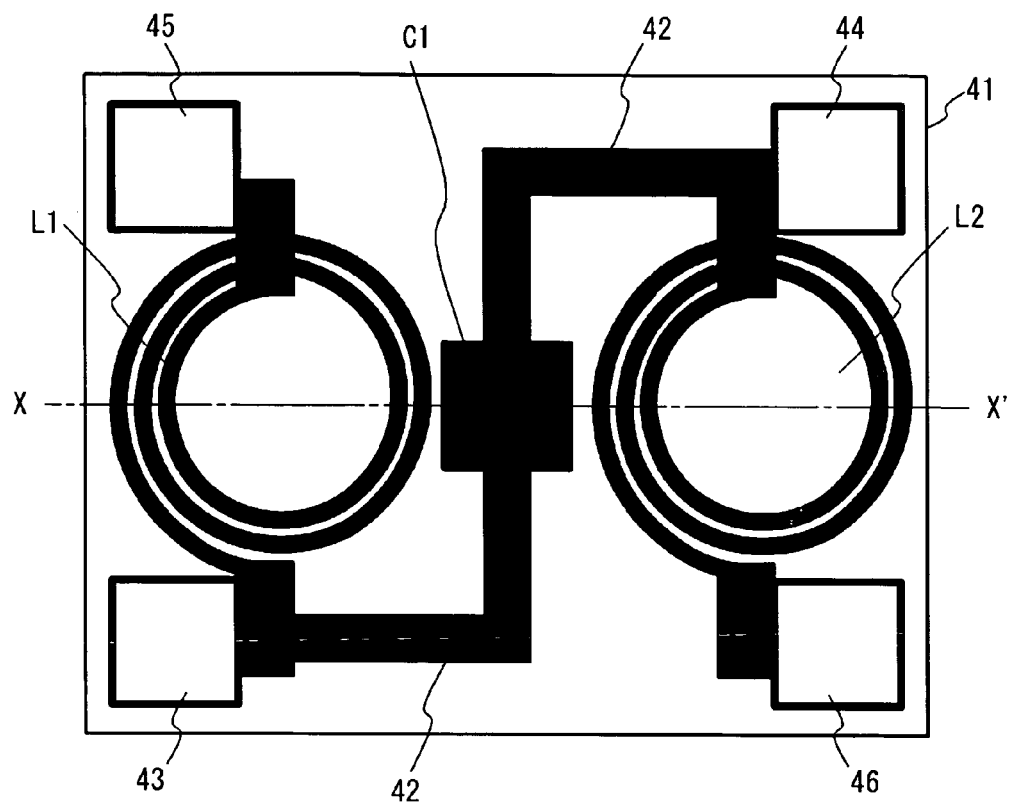
FIGS. 21A and 21B are plan and cross-sectional views of the first IPD employed in the first embodiment of the present invention.
Figure 21B:
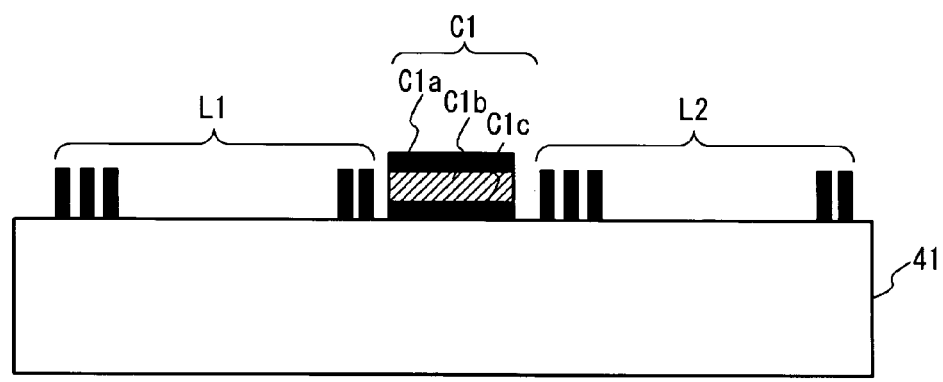

FIGS. 21A and 21B show the structures of the first and second IPDs 40 and 50 shown in FIG. 10 more specifically, in which FIG. 21A is a plan view thereof. The parts that are the same as those shown in FIG. 10 are given the same reference numerals. The inductors L1 and L2 are formed by spiral coils. FIG. 21B is a cross-sectional view taken along a line X-X' shown in FIG. 21A. The inductors L1 and L2 are formed by a conductor provided on the support substrate 41, in which the conductor may be aluminum. The capacitor C1 is an MIM capacitor composed of a lower electrode C1c, a dielectric film C1b such as a silicon oxide film, and an upper electrode C1a.

As described with reference to FIGS. 9 and 15-18, the inductors LP1, LP2, LP1' and LP2' are formed within the multi-layered package 10, in which these inductors form the additional inductance circuits 70 and 80 provided between the parallel-arm resonators P1 through P4 and the ground and between the parallel-arm resonators P1' through P4' of the ladder-type filter. The inductors L1, L2, L3 and L4 are formed on the first IPD 40 or the second IPD 50 and are flip-chip mounted (facedown bonded) on the package 10, in which these inductors form the phase shifters (phase matching circuits) provided between the first filter 20 and the antenna terminal 60 and between the second filter 30 and the antenna terminal 60.

The first and second IPDs 40 and 50 include the phase shifters (phase matching circuits) for establishing the phase match between the first and second filters 20 and 30, and the conductive patterns 14 for the inductors LP1, LP2, LP1' and LP2' are formed in the package (multilayered substrate) 10.

With the above structure, the additional inductors 70 and 80 are spatially separated from the phase shifters. It is thus possible to prevent the inductors LP1, LP2, LP1' and LP2' of the additional inductance circuits 70 and 80 from being coupled with the inductors L1 through L4 of the phase shifters and to prevent the performance from being deteriorated, as compared with the conventional arrangement in which the inductors for the duplexer including the inductors L1 through L4 are formed within the multilayered package 10. In addition, the phase shifters can be tuned by merely replacing the first IDT 40 or the second IDT 50 by another one. Each of the first and second IPDs 40 and 50 have inductors and capacitors on the respective single chips and enables downsizing, as compared to the conventional arrangement in which the discrete components such as chip capacitors and chip inductors are mounted.

The first and second filters 20 and 30 and the first and second IPDs 40 and 50 are facedown mounted on the package (substrate). The flip-chip mounting (facedown mounting) makes a space that is between the first and second IPDs 40 and 50 and the package 10 and are not full of the substrates of the IPD chips and the package 30. It is thus possible to further suppress the coupling between the inductors LP1, LP2, LP1' and LP2' of the inductors 70 and 80 and the inductors L1 through L4 of the phase shifters. Furthermore, there is no need to provide land patterns for soldering in mounting of the individual components. This reduces the mount area.

Second Embodiment

The first and second IPDs 40 and 50 for the phase shifters will be further considered. The phase shifters are required to have matching performance and low insertion loss.

Figure 22A:
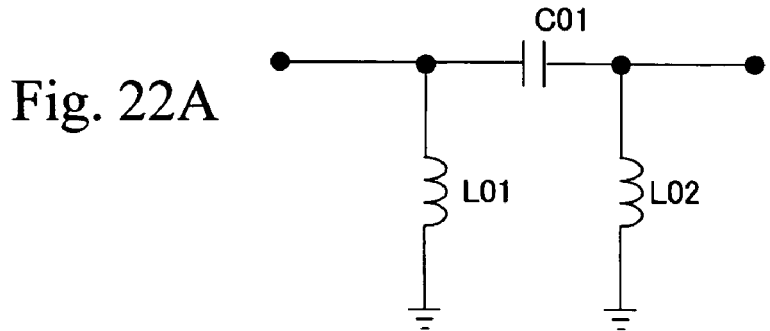
Figure 22B:
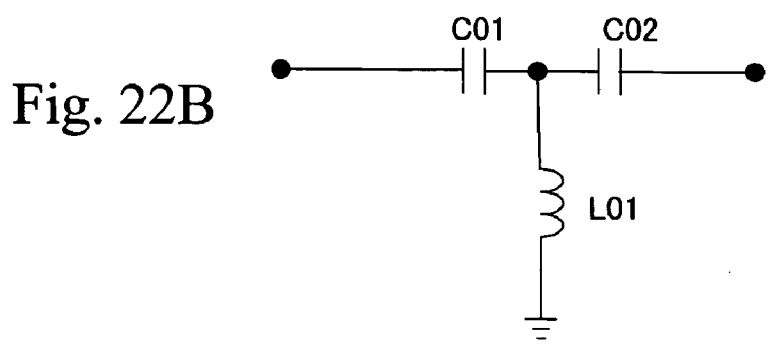
Figure 22C:
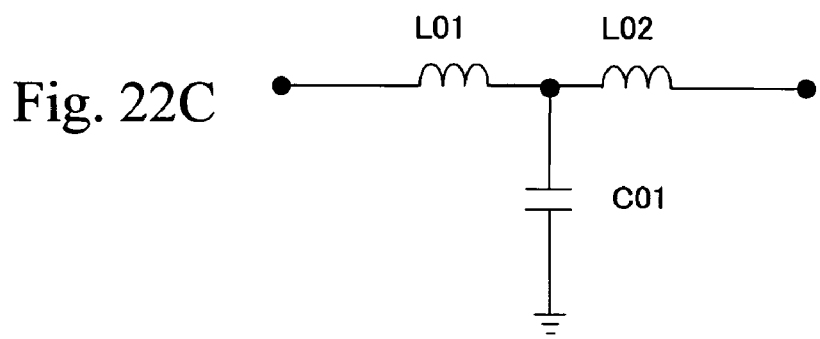
Figure 22D:
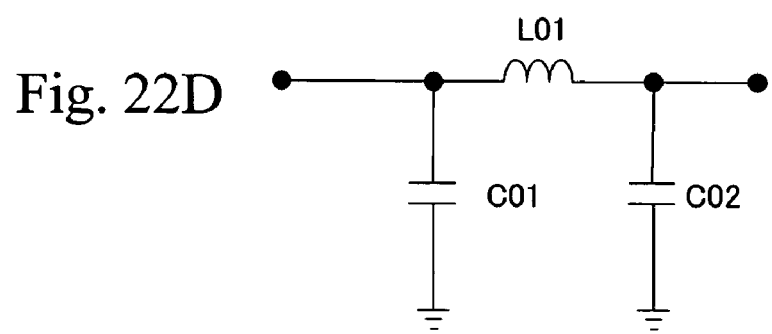

First, the matching performance is considered. In order to realize good matching performance, it is preferable to use lumped-parameter type elements composed of three structural elements as shown in FIGS. 22A through 22D. FIG. 22A shows a n-type L-C-L circuit in which a capacitor C01 is connected in series between the input and output terminals, and inductors L01 and L02 are connected in parallel therebetween. FIG. 22B shows a T-type C-L-C circuit in which the capacitors C01 and C02 are connected in series between the input and output terminals, and the inductor L01 is connected in parallel therebetween. FIG. 22C shows a T-type L-C-L circuit in which the inductors L01 and L02 are connected in series between the input and output terminals and the capacitor C01 is connected in parallel therebetween. FIG. 22D shows a n-type C-L-C circuit in which the inductor L01 is connected in series between the input and output terminals and the capacitors C01 and C02 are connected in parallel therebetween. The use of these four different lumped constant type elements realizes any impedance matching.

Now, the insertion loss is considered. In order to realize low insertion loss, it is preferable to have structural elements connected in series as small as possible and to have great Q in order to realize small insertion loss. Generally, the Q value of inductors ranges from 20 to 40, while the Q value of capacitors ranges from 40 to 60. From this viewpoint, it is preferable to use the n-type L-C-L circuit shown in FIG. 22A in which only one capacitor C01 is connected in series.

Figure 23:
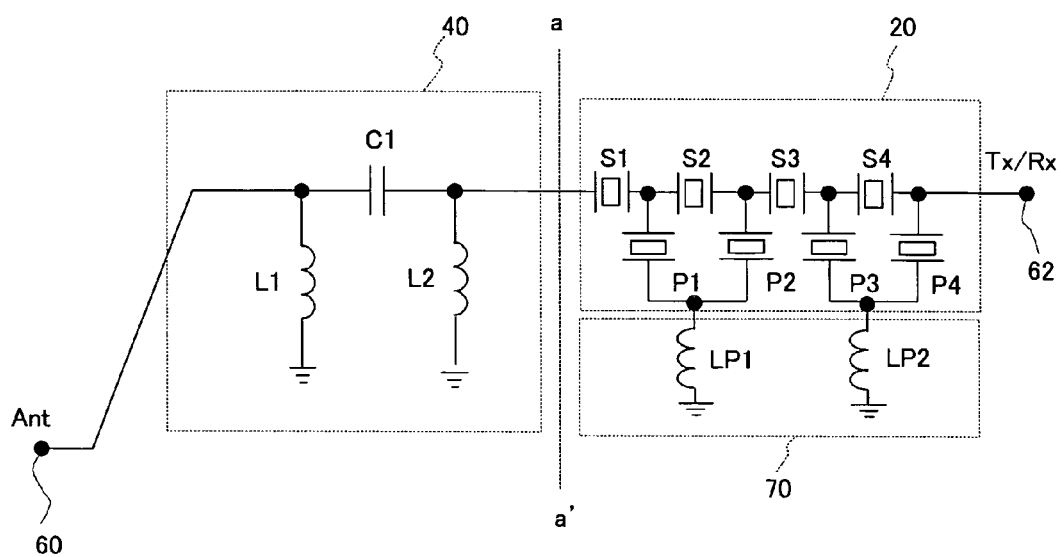
FIG. 23 is a circuit diagram of a filter with a phase shifter formed by the lumped parameter type circuit shown in FIG. 22A.
Figure 24A:
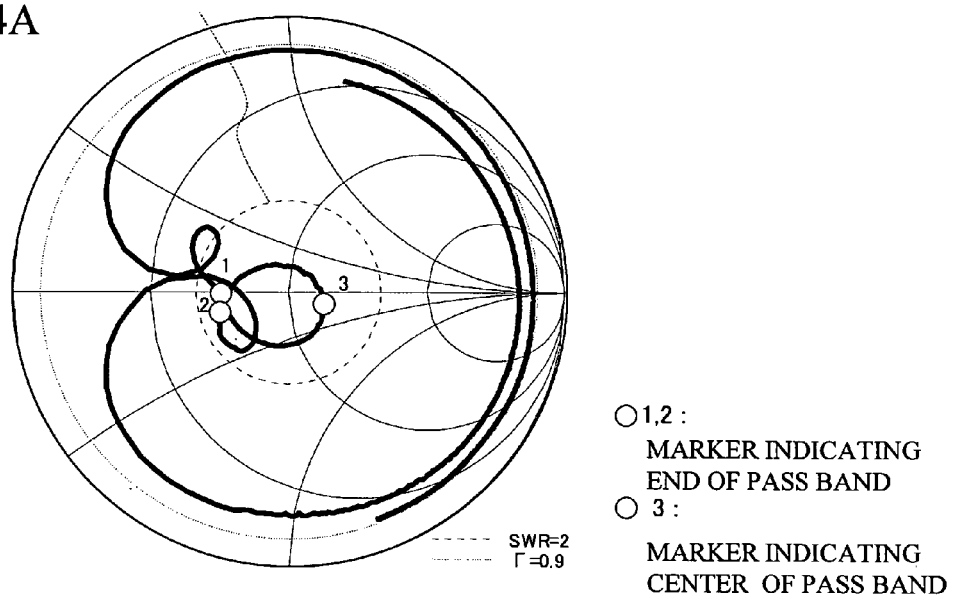
FIG. 24A is a Smith chart of the reflection characteristic of the filter shown in FIG. 23 viewed from an antenna terminal Ant.
Figure 24B:
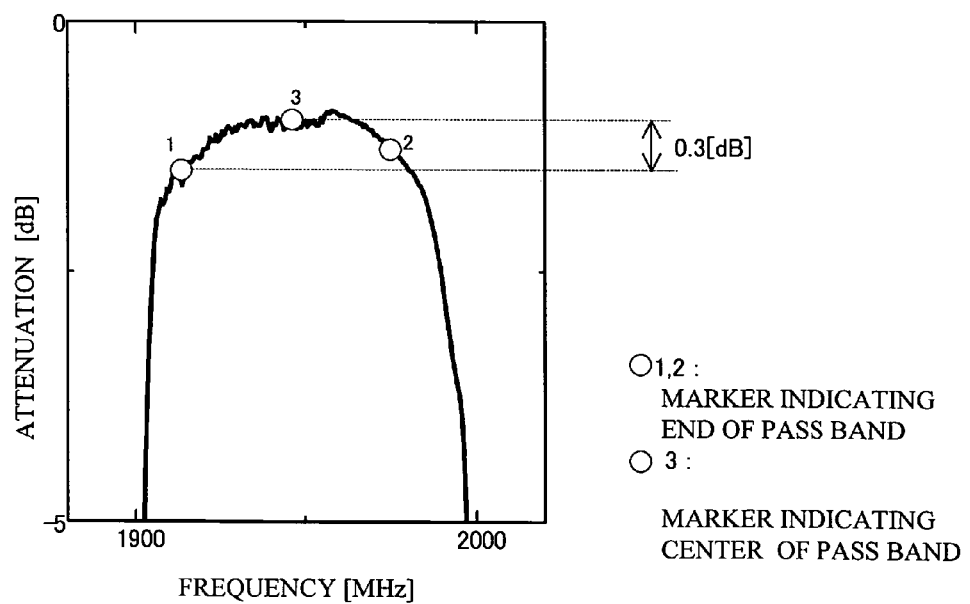
FIG. 24B is a graph of the pass-band characteristic of the filter shown in FIG. 23.

FIG. 23 is a circuit diagram of a filter that forms the phase sifter to which the circuit shown in FIG. 22A is applied. FIG. 23 shows a circuit configuration corresponding to the first filter 20 and the first IPD 40 shown in FIG. 9. In FIG. 23, the first IPD 40 is terminated by the series-arm resonator S1 of the first filter 20, while the configuration in FIG. 9 is terminated by the different manner. Except the termination, the first filter 20 and the first IPD 40 shown in FIG. 23 are the same as those shown in FIG. 9, and the same reference numerals refer to the same components. FIG. 24A is a Smith chart that describes the reflection characteristic of the filter shown in FIG. 23 viewed from the antenna terminal (Ant) 60 shown in FIG. 23. In FIG. 24A, a broken line V denotes a VSWR (Voltage Standing Wave Ratio) equal to 2. Generally, it is desired that the VSWR is lower than 2. In FIGS. 24A and 24B, circles numbered 1, 2 and 3 denote the low-frequency-side end of the pass band of the filter, the high-frequency-side end thereof, and the center frequency thereof, respectively. Hereinafter, the circles numbered 1, 2 and 3 are respectively referred to as markers 1, 2 and 3.

FIG. 24A shows that the markers 1, 2 and 3 are smaller than the VSWR of 2. That is, the VSWR is lower than 2 over the pass band. FIG. 24B shows that the difference among the markers 1 through 3 is equal to 0.3 dB. It can be seen from FIGS. 24A and 24B that the filter shown in FIG. 23 has excellent filter performance, more specifically, a small VSWR and a flat pass band characteristic.

Figure 25A:
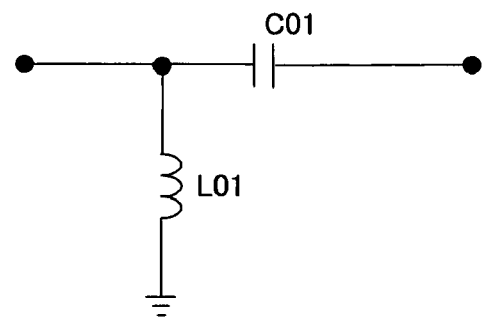
Figure 25B:
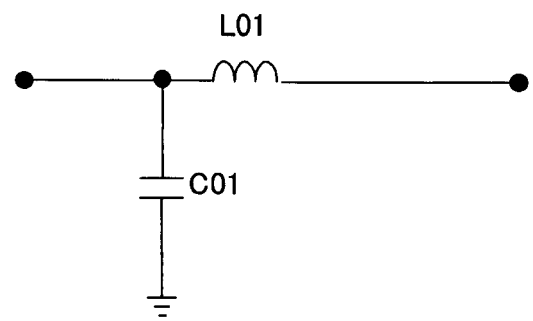
Figure 25C:
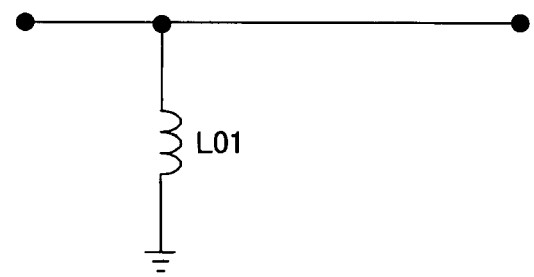
Figure 25D:
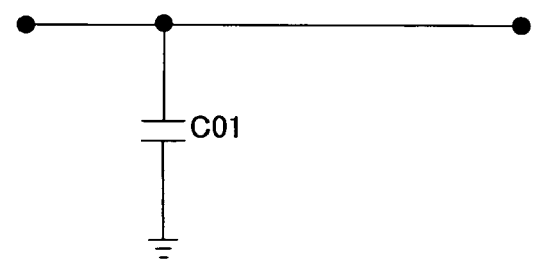
Figure 25E:
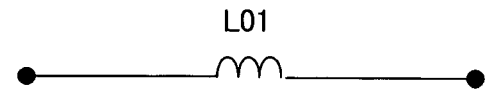
Figure 25F:
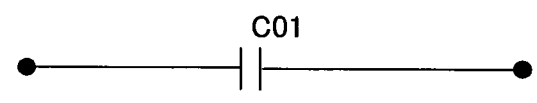

The phase sifters composed of three elements have been considered. A further consideration will now be given of phase shifters that are composed of two elements or only one element. FIGS. 25A and 25B show phase shifters, each of which is composed of two lumped constant type elements. FIG. 25A shows a circuit in which the capacitor C01 is connected in series between the input and output terminals and the inductor L01 is connected in parallel therebetween. FIG. 25B shows a circuit in which the inductor L01 is connected in series between the input and output terminals and the capacitor C01 is connected in parallel therebetween. FIGS. 25C through 25F show phase shifters, each of which consists of a single lumped constant type element. More particularly, FIG. 25C shows the inductor L01 connected in parallel between the input and output terminals. FIG. 25D shows the capacitor connected in parallel between the input and output terminals. FIG. 25E shows the inductor L01 connected in series between the input and output terminals. FIG. 25F shows the capacitor C01 connected in series between the input and output terminals.

As in the case of the phase sifters composed of three elements, it is preferable to have elements connected in series as small as possible and employ a capacitor connected in series in order to realize small insertion loss. From this viewpoint, it is preferable to use the circuit shown in FIG. 25A for the two-element configuration and to use the circuit shown in FIG. 25C for the single-element configuration.

Figure 26:
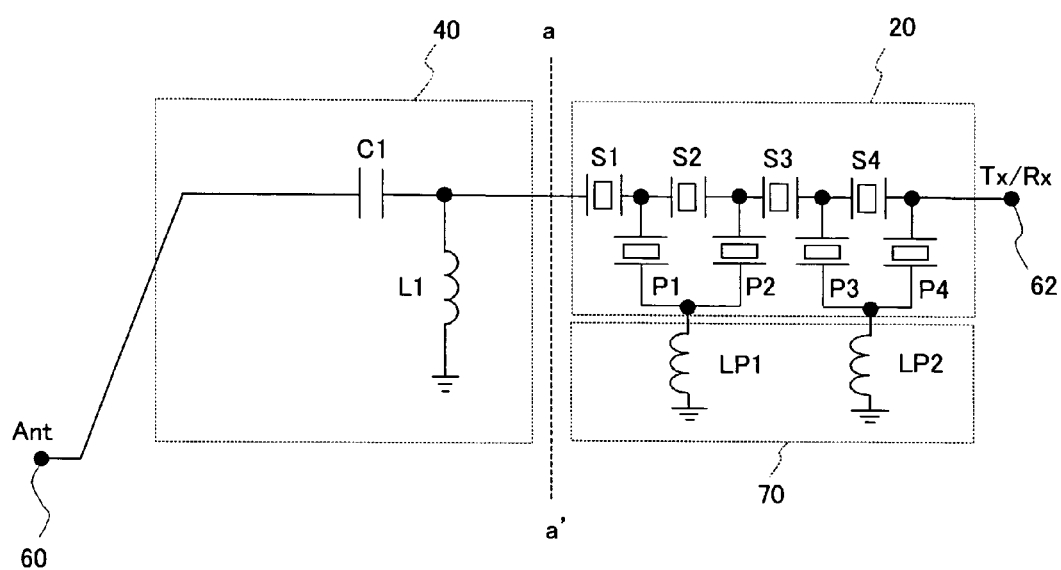
FIG. 26 is a circuit diagram of a filter with the phase shifter formed by the lumped parameter type circuit shown in FIG. 25A.

FIG. 26 shows a circuit configuration of a filter for the phase shifter to which the circuit (composed of two elements) shown in FIG. 25A is applied. In the filter shown in FIG. 26, the first IPD 40 has the capacitor C1 connected in series between the antenna terminal 60 and the first filter 20, and the inductor L1 connected in parallel. The other components and connections are the same as those shown in FIG. 23, and the same reference numerals denote the same elements.

Figure 27:
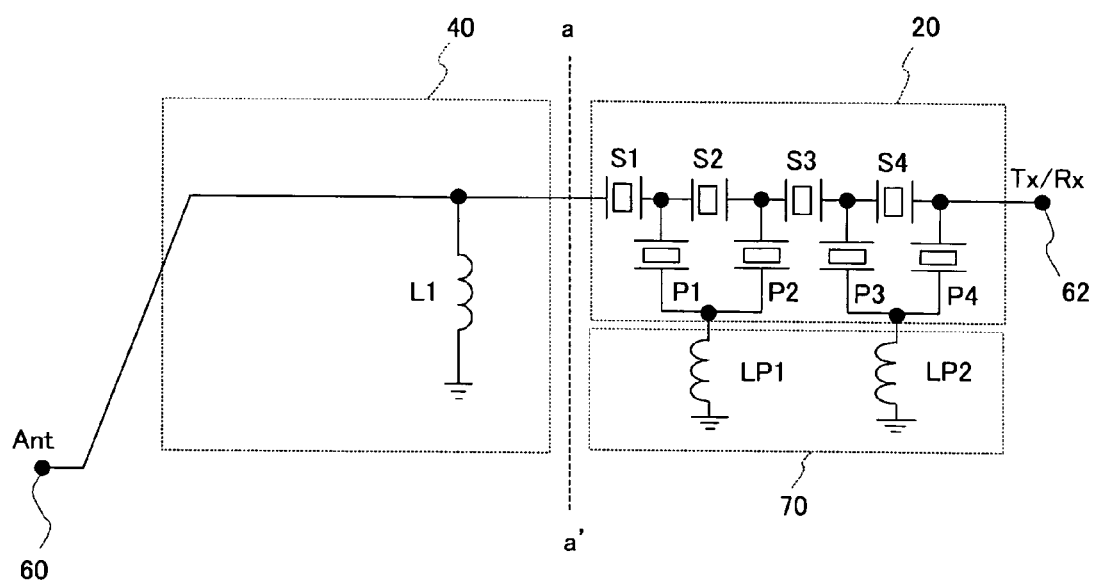
FIG. 27 is a circuit diagram of a filter with the phase shifter formed by the lumped parameter type circuit shown in FIG. 25C.

FIG. 27 shows a circuit configuration of another filter for the phase shifter to which the circuit (composed of a single element) shown in FIG. 25C is applied. In the filter shown in FIG. 27, the first IPD filter 40 has the inductor L1 connected in parallel between the antenna terminal 60 and the first filter 20. The other components and connections are the same as those shown in FIG. 23, and the same reference numerals denote the same elements.

Figure 28A:
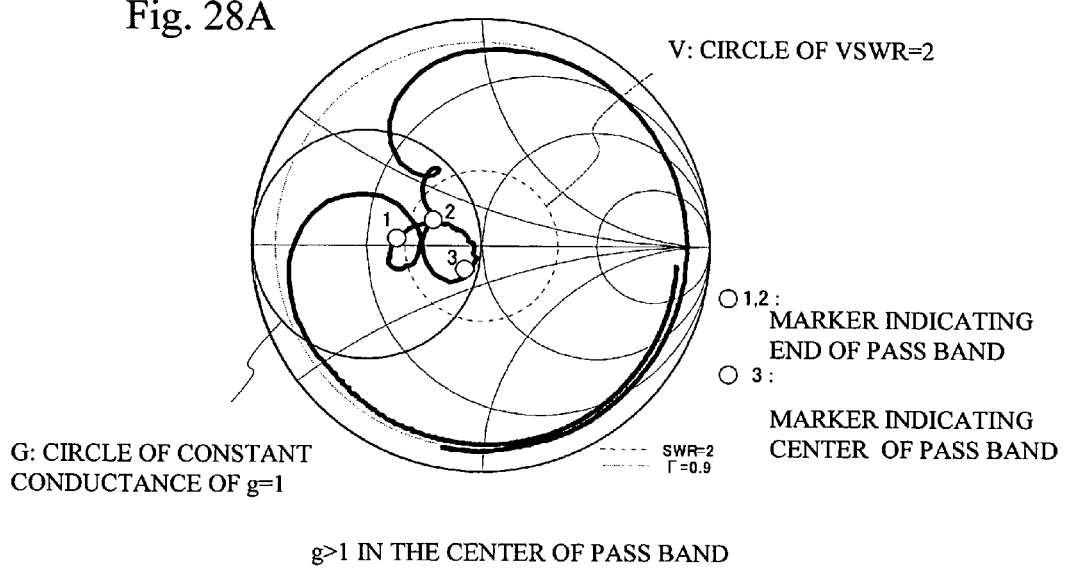
FIGS. 28A and 28B are Smith charts of the filter shown in FIG. 26 viewed from the antenna terminal Ant, in which FIG. 28A relates an arrangement in which the resistance component Re{Z} of marker 3 is smaller than 1, and FIG. 28B relates to an arrangement in which Re{Z} of marker 3 is greater than 1.
Figure 28B:
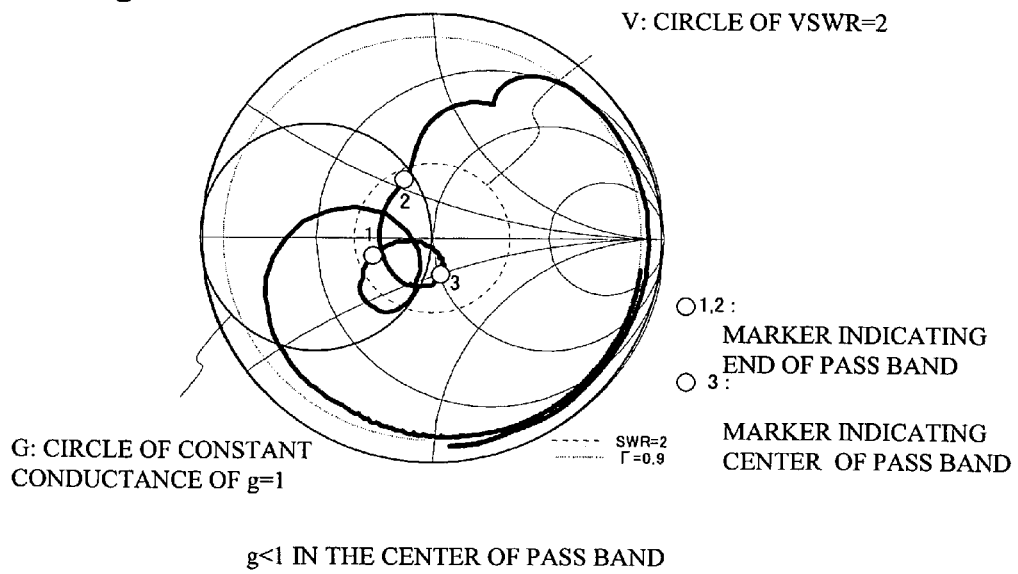

FIGS. 28A and 28B are Smith charts of the reflection characteristics of the filter shown in FIG. 26 viewed from the antenna terminal 60. In FIGS. 28A and 28B, a broken line V denotes a VSWR (Voltage Standing Wave Ratio) equal to 2, and a solid line denotes a conductance g of 1 (this definition is also applied to FIGS. 30A and 30B, which will be described later). Like FIGS. 24A and 24B, the low-frequency-side end, the high-frequency-side end and the center frequency of the pass band of the filter are referred to as markers 1, 2 and 3, respectively (this definition is also applied to FIGS. 29A through 31B, which will be described later).

The normalized impedance Z is defined as the value obtained by dividing the impedance viewing the first filter 20 from the antenna terminal Ant by the termination resistance of the first filter 20. The conductance g is the reciprocal of the resistance component Re{z} of the normalized impedance Z. When the marker is located inside the circle of g=1, the resistance component Re{Z} of the normalized impedance Z viewing the first filter 20 from the antenna terminal Ant at the marker frequency is smaller than 1. In contrast, when the marker is located outside of the circuit of g=1, the resistance component Re{Z} of the normalized impedance Z viewing the first filter 20 from the antenna terminal Ant at the marker frequency is greater than 1.

FIG. 28A shows an exemplary filter in which the resistance component Re{Z} of the marker 3 is smaller than 1 (that is, the marker 3 is located inside the circle of g=1). In this case, the marker 1 is located outside of the circle V in which VSWR=2. That is, the VSWR of the marker 1 is greater than 2. FIG. 28B shows an exemplary filter in which the resistance component Re{Z} of the marker 3 is greater than 3 (that is, the marker is located outside of the circle W), In this case, the markers 1 through 3 are located inside the circuit of VSWR=2. That is, the VSWRs of the markers 1 through 3 are equal to or smaller than 2.

Figure 29A:
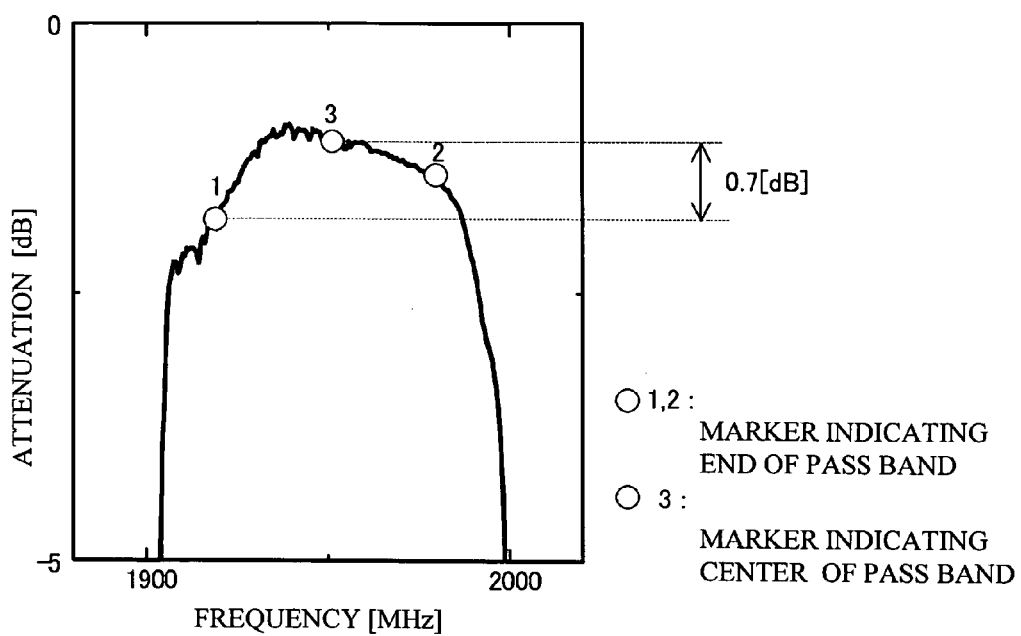
FIGS. 29A and 29B are graphs of pass band characteristics of the filters shown in FIGS. 28A and 28B, respectively.
Figure 29B:
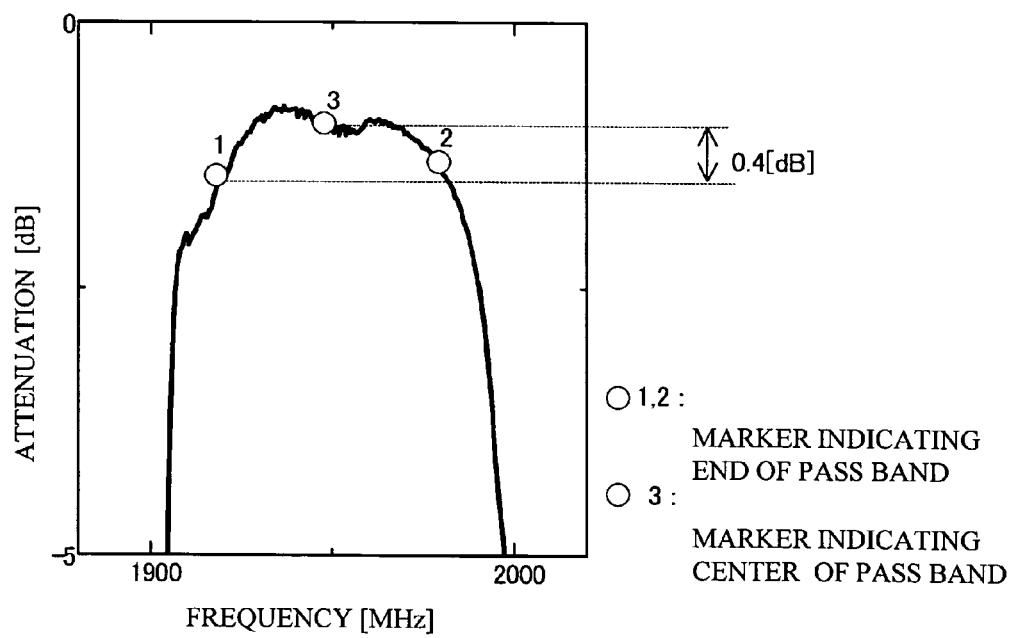

FIGS. 29A and 29B show frequency characteristics of the pass band of the filter (composed of two elements applied to the phase shifter)shown in FIG. 26. More specifically, FIG. 29A shows the frequency characteristic of the pass band of the filter shown in FIG. 28A (the resistance component Re{Z} of the marker 3 is smaller than 1). In this case, the difference in attenuation among the markers 1 through 3 is 0.7 dB. FIG. 29B shows the frequency characteristic of the pass band of the filter shown in FIG. 28B (the resistance component Re{Z} of the marker is greater than 1). In this case, the difference in attenuation among the markers 1 through 3 is 0.4 dB.

Figure 30A:
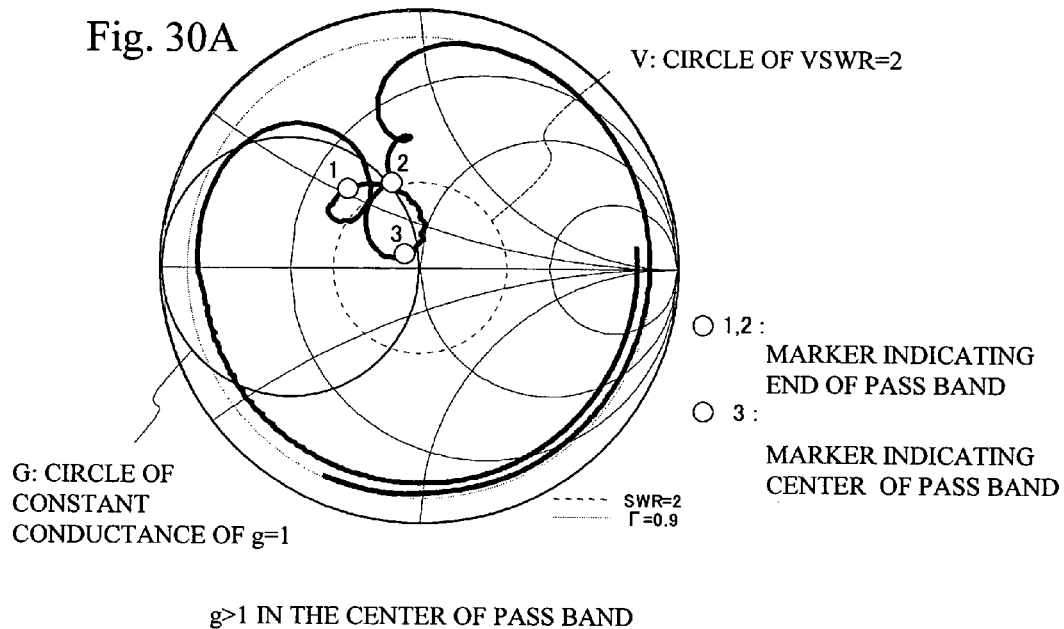
FIGS. 30A and 30B are Smith charts of the filter shown in FIG. 27 viewed from the antenna terminal Ant, in which FIG. 30A relates to an arrangement in which Re{Z} of marker 3 is smaller than 1, and FIG. 30B relates to an arrangement in which Re{Z} of marker 3 is greater than 1.
Figure 30B:
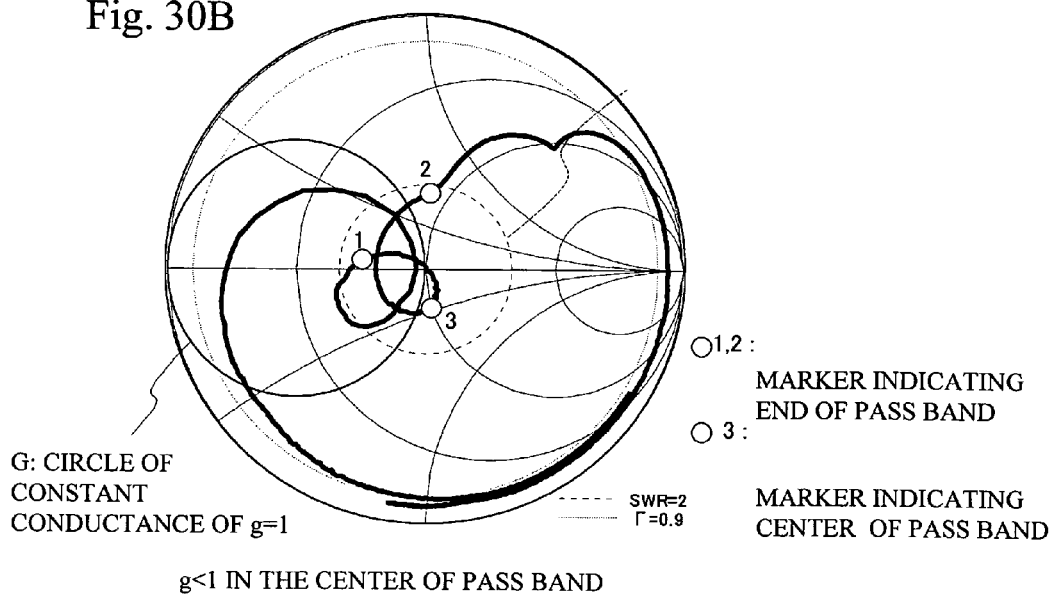

FIGS. 30A and 30B are Smith charts of the reflection characteristic of the filter shown in FIG. 27 (a single element is applied to the phase shifter) viewed from the antenna terminal Ant. More specifically, FIG. 30A shows an exemplary filter in which Re{Z} of the marker 3 is smaller than 1. In this case, the VSWRs of the markers 1 and 2 are greater than 2. In contrast, FIG. 30B shows an exemplary filter in which Re{Z} of the marker 3 is greater than 1. In this case, the VSWRs of the markers 1 through 3 are smaller than 2.

Figure 31A:
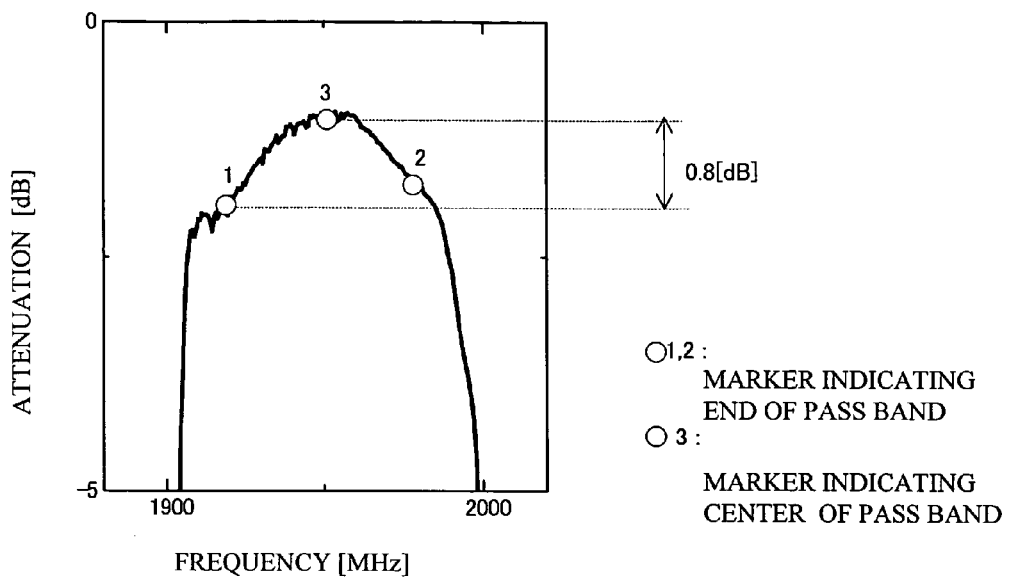
FIGS. 31A and 31B are graphs of pass bands characteristics of the filters shown in FIGS. 30A and 30B.
Figure 31B:
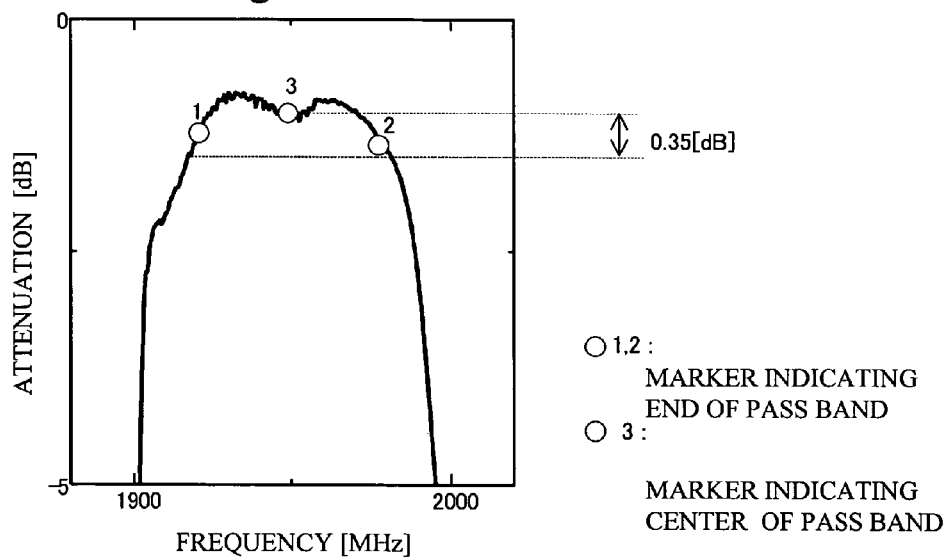

FIGS. 31A and 31B show the frequency characteristics of the pass band of the filter shown in FIG. 27 (a single element is applied to the phase shifter). More particularly, FIG. 31A shows the frequency characteristic of the pass band of the filter shown in FIG. 30A (Re{Z} of the marker 3 is smaller than 1). In this case, the difference in attenuation among the markers 1 through 3 is 0.8 dB. FIG. 31B shows the frequency characteristic of the pass band of the filter shown in FIG. 30B (Re{Z} of the marker 3 is greater than 1). In this case, the difference in attenuation among the markers 1 through 3 is 0.35 dB.

It can be seen from FIG. 28A through FIG. 31B that, in a case where Re{Z} obtained by viewing the filter from the antenna Ant at the center frequency (marker 3) of the pass band, the VSWR of the low-frequency-side end (marker 1) or the high-frequency-side end (marker 2) of the pass band exceeds 2 in the reflection characteristic viewing the filter from the antenna Ant. Further, the attenuation difference in the pass band (the markers 1 through 3) becomes larger. In contrast, in a case where Re{Z} obtained by viewing the filter from the antenna Ant at the center frequency (marker 3) of the pass band, the VSWR of the pass band (markers 1 through 3) is equal to or smaller than 2 in the reflection characteristic viewing the filter from the antenna Ant. Further, the attenuation difference in the pass band (markers 1 through 3) becomes smaller.

As described above, even the filter having the phase shifter composed of two elements or single element is capable of realizing the characteristics (the VSWR is smaller than 2 in the pass band and the attenuation difference is small) similar to those of the phase shifter composed of three elements shown in FIG. 23 by setting Re{Z} obtained by viewing the filter from the antenna terminal Ant at the center frequency of the pass band greater than 1.

A description will now be given of the condition for making Re{Z} obtained by viewing the filter from the antenna terminal Ant at the center frequency of the pass band greater than 1. In the filter shown in FIG. 26 or FIG. 27, Re{Z} at the center frequency of the pass band is equal to or greater than the resistance component Re{Z0} (the reciprocal of the conductance) of the normalized impedance Z0 obtained viewing the filter 20 from an interface (a-a' plane in FIG. 26 or FIG. 27) between the phase shifter and the first filter 20. This is due to the fact that the filter shown in FIG. 26 has the arrangement in which the capacitor C1 is connected in series first, and the inductor L1 is connected in parallel second. It is to be noted that the inductor L1 is connected in parallel in FIG. 26.

That is, Re{Z}≧Re{Z0}. Thus, when Re{Z0}>1 is satisfied, then Re{Z}>1 is satisfied. In the ladder-type filter, the resistance component of the normalized impedance Z0 at the center frequency of the pass band obtained by viewed from the filter end is expressed as follows:

$$(Re\{Z0\} \times R)^2 = 1/((2\pi f_0)^2 \times Cp \times Cs)$$

where Cp is the capacitance of the parallel-arm resonator P1 of the first filter 20 closest to the phase shifter, Cs is the capacitance of the series-arm resonator S1 of the first filter 20 closet to the phase shifter, R is the termination resistance of the first filter 20, and $f_0$ is the center frequency of the pass band.

The following is obtained by applying Re{Z0}>1 to the above expression:

$$Cp \times Cs < 1/(R \times 2\pi f_0)^2$$

Figure 18:
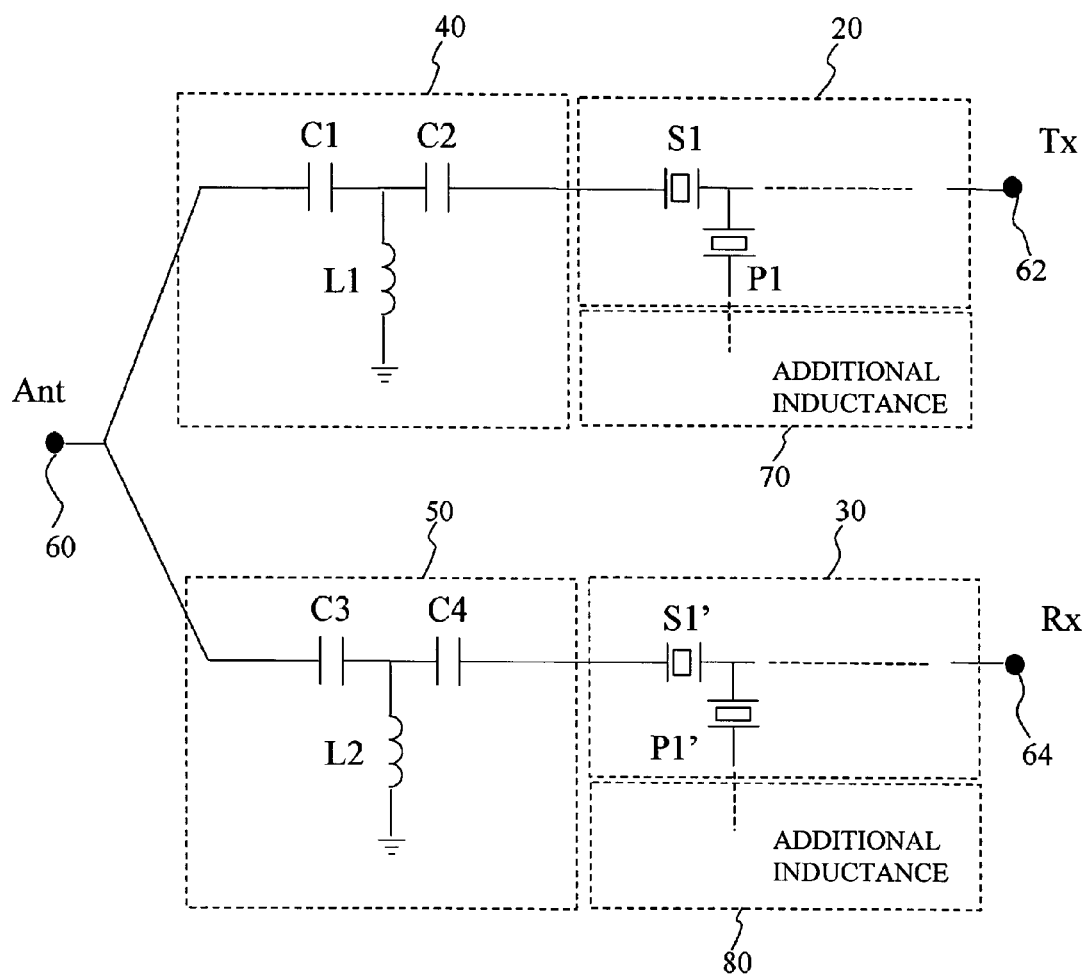
FIG. 18 shows circuit configurations of the first and second IPDs and a structure of terminating these IPDs.
Figure 32:
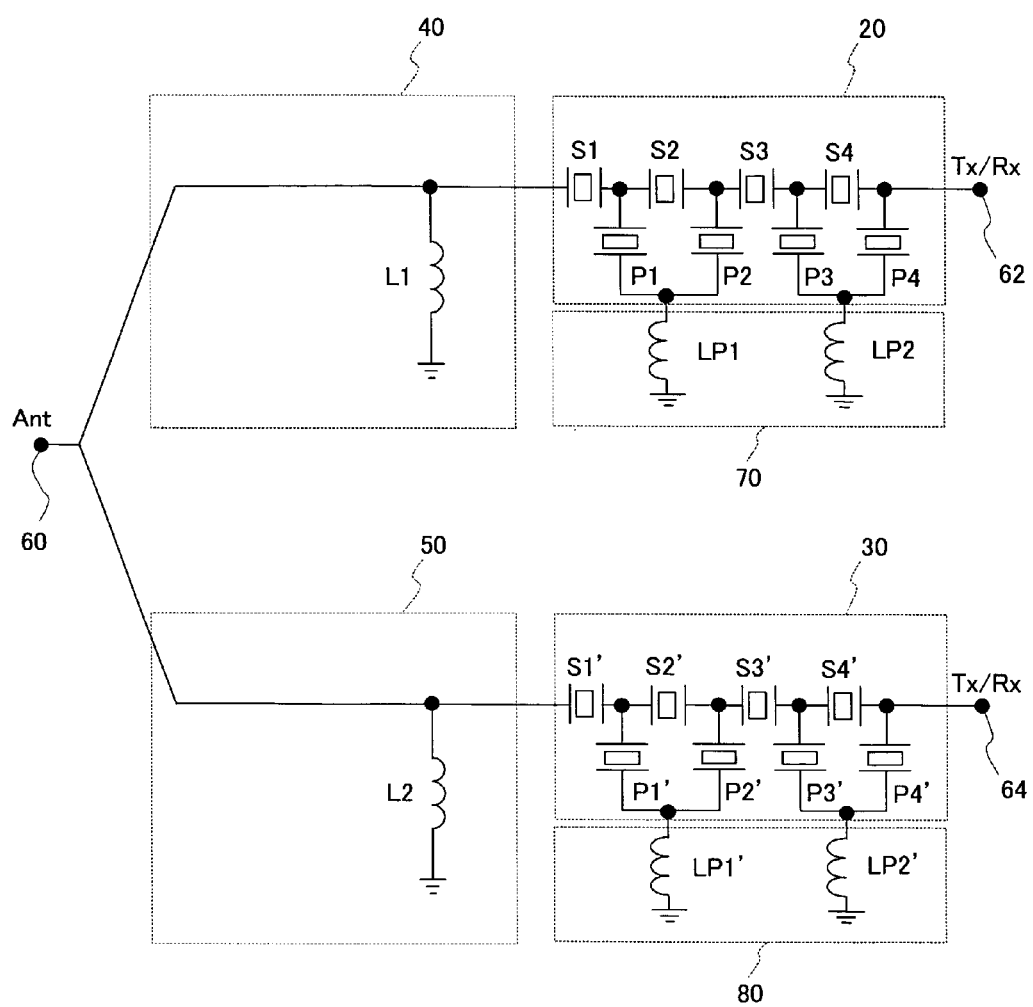
FIG. 32 is a circuit diagram of a duplexer according to a second embodiment of the present invention.

FIG. 32 is a circuit diagram of a duplexer according to the second embodiment of the present invention. This duplexer has an exemplary structure with the phase shifter consisting of a single element. The first and second IPDs of the duplexer according to the first embodiment shown in FIG. 9 are replaced with the phase matching circuits composed of the single element shown in FIG. 25C. The first and second filters 20 and 30 terminate the first and second IPDs 40 and 50 with the series-arm resonators S1 and S1' as shown in FIG. 18. The series-arm resonators S1 and S1' of the first and second filters 20 and 20 closer to the antenna terminal (Ant) 60 has capacitance values as will be described later. The other structures and connections are the same as those shown in FIG. 9, and a description thereof will be omitted.

The duplexer according to second embodiment includes the first filter 20 composed of FBARs (S1 through S4 and P1 through P4) arranged in a ladder form, and the second filter 30 composed of FBARs (S1' through S4' and P1' through P4') arranged in a ladder form. Further, the duplexer has the first phase matching circuit (the first IPD 40) and the second phase matching circuit (the second IPD 50). The first matching circuit is proved between the first filter 20 and the antenna terminal Ant (common terminal) and establishes the phase matching. The second matching circuit is provided between the second filter 30 and the antenna terminal Ant and establishes the phase matching. Further, the duplexer includes the inductors L1 and L2, which are respectively included in the first and second IPDs 40 and 50 and are connected between the common terminal and the ground. Further, the first and second filters 20 and 30 of the duplexer satisfy Cp×Cs<1/(R× $2\pi f_0)^2$ where Cp is the capacitances of the parallel-arm resonators P1 and P1' of the first and second filters 20 and 30 closest to the first and second IPDs 40 and 50, Cs is the capacitances of the series-arm resonators of the first and second filters 20 and 30 closest to the first and second IPDs 40 and 50, R is the termination resistance of the first filter 20, and $f_0$ is the center frequency of the pass band.

With the above structure, the conductance g of the normalized impedance obtained by viewing the first and second filters 20 and 30 from the antenna terminal Ant becomes greater than 1, and the VSWR in the pass band is made smaller than 2. Further, the attenuation difference in the pass band can be reduced. In addition, the number of structural elements for the phase shifters (phase matching circuits) can be reduced and the mount area can be reduced.

Third Embodiment

Figure 33:
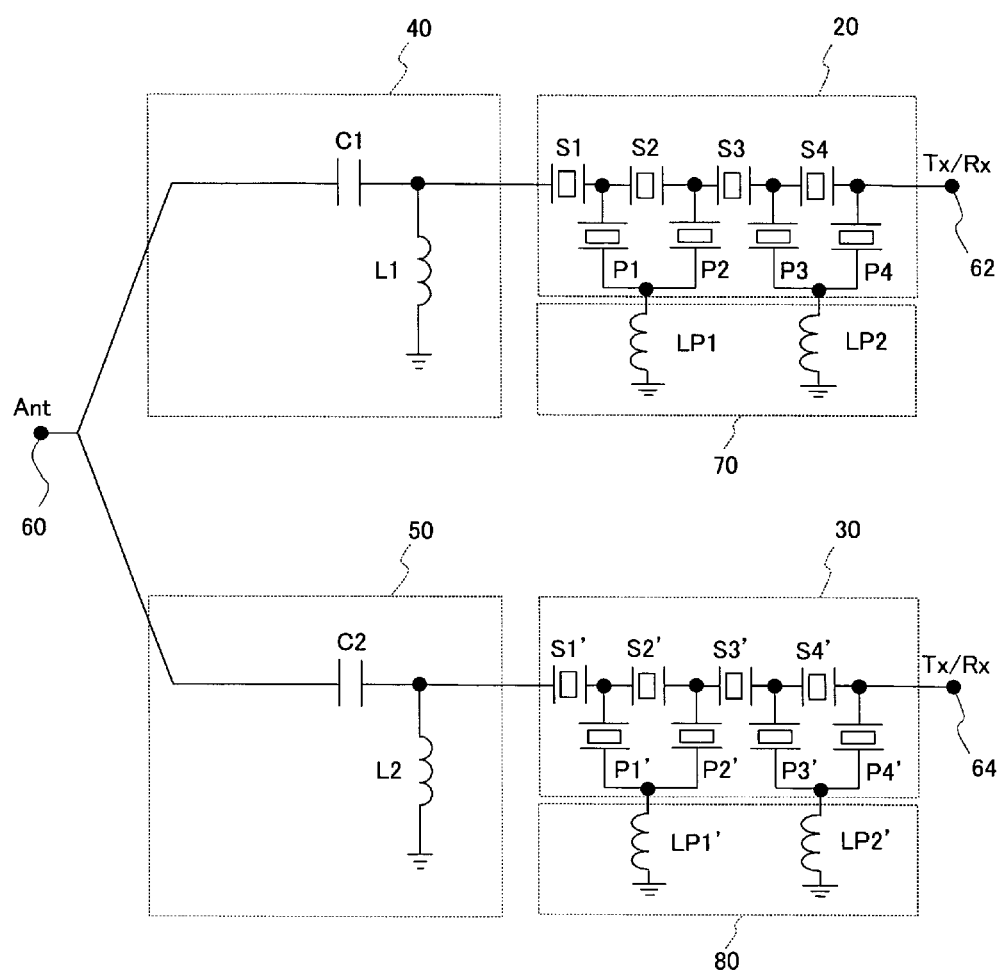
FIG. 33 is a circuit diagram of a duplexer according to a third embodiment of the present invention.

FIG. 33 is a circuit diagram of a duplexer according to a third embodiment of the present invention. This duplexer is equipped with the phase shifters each composed of two elements shown in FIG. 25A. In addition to the structure of the duplexer according to the second embodiment, the present invention includes capacitors C1 and C2, which are respectively provided in the first and second IPDs 40 and 50 (phase matching circuits) and are connected between the antenna terminal 60 and the first and second filters 20 and 30. The other structures and connections are the same as those of the second embodiment. The duplexer shown in FIG. 33 brings about the same advantages as those of the duplexer of the second embodiment.

The first and second filters 20 and 30 of the duplexers of the second and third embodiments are further described. Although the following description is specifically directed to the first filter 20, it may be applied to the second filter 30. In the second and third embodiments, multiple relationships between Cp and Cs that satisfy Cp×Cs are available. Among the available relationships, preferably, the series-arm resonator S1 of the first filter 20 closest to the first IPD 40 is made small. If the capacitance other than S1 may be changed, reflection of signal may occur because of the impedance difference between stages of the ladder arrangement.

Figure 34A:
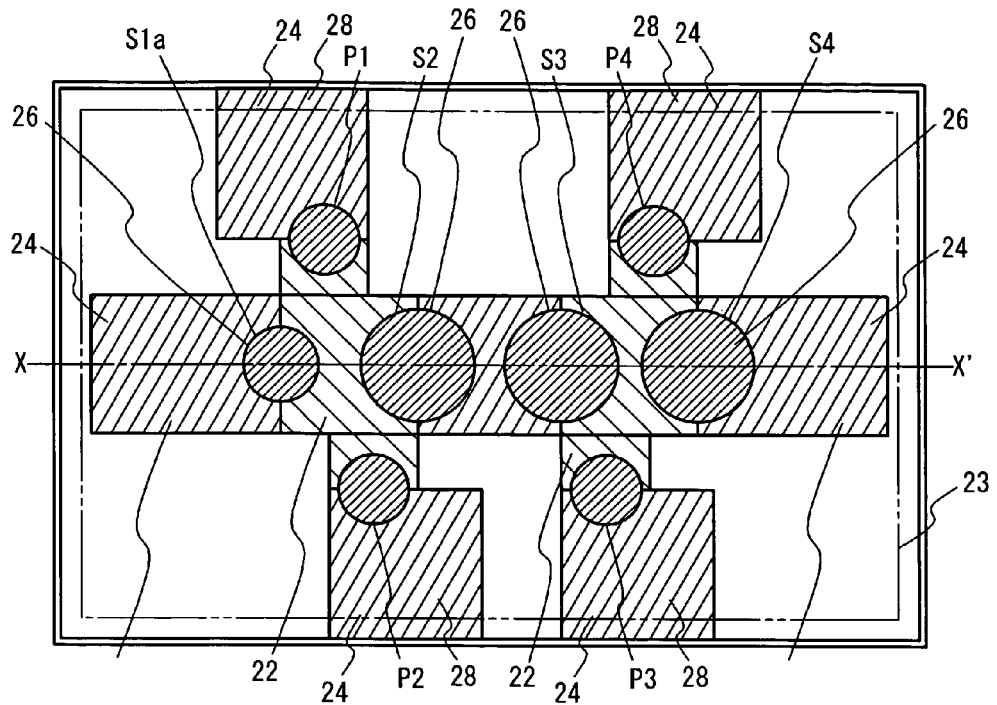
FIG. 34A is a plan view of the first filer employed in the second and third embodiments of the present invention.
Figure 34B:
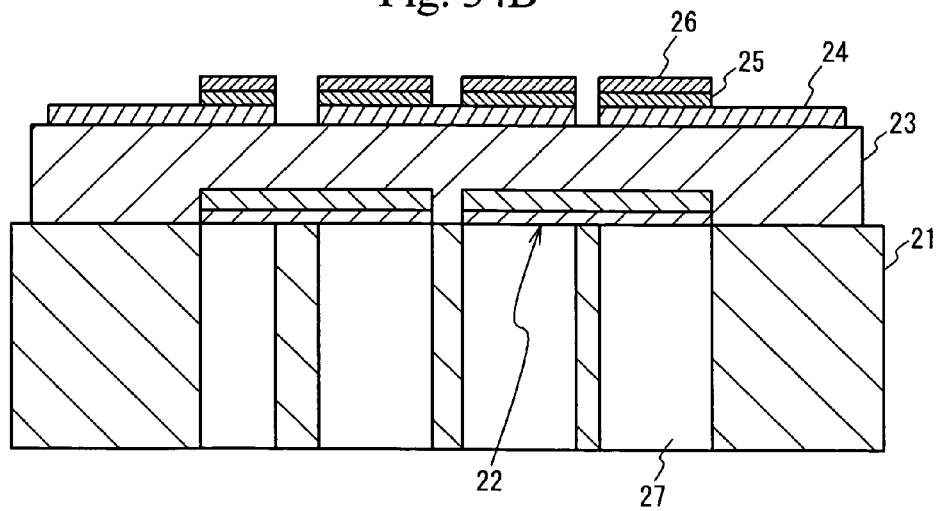
FIG. 34B is a cross-sectional view taken along a line X-X' shown in FIG. 34A.

FIG. 34A are plan views of the first filter 20 used in each of the duplexers of the second and third embodiments (in which the piezoelectric film 23 is depicted by the two-dotted line in order to describe the lower electrode film 22), and FIG. 34B is a cross-sectional view taken along a line X-X' shown in FIG. 34A. A membrane region is available where the lower electrode film 22, the piezoelectric film 23 and the upper electrode film 24 overlap. In FIGS. 34A and 8A, the adjustment film 26 is aligned with the membrane region. That is, the region in which the adjustment film 26 is provided coincides with the membrane region in FIGS. 34A and 8A. In FIGS. 34A and 34B, the membrane region of a series-arm resonator S1$a$ is smaller than the membrane regions of the other series-arm resonators S2 through S4. That is, the area of the membrane region of the series-arm resonator S1$a$ of the first filter 20 closest to the first IPD 40 (first phase matching circuit) is smaller than the membrane regions of the other series-arm resonators S2 through S4 of the first filter 20. This results in the capacitance of the series-arm resonator S1$a$ smaller than the capacitances of the other series-arm resonators S2 through S4.

In the second and third embodiments, each of the first and second IPDs 40 and 50 is the phase matching circuit composed of two elements or the single element, and each of the first and second filters 20 and 30 satisfies Cp×Cs<1/(R× $2\pi f_0$)$^2$. Alternatively, either one of the phase matching circuits and either one of the first and second filters 20 and 30 may satisfy the above-mentioned conditions. This alternative filter has a VSWR smaller than 2 in the pass band, and the attenuation difference in the pass band can be reduced. Further, the mount area for the phase shifters (phase matching circuits) can be reduced.

The second through fourth embodiments employ the first and second IPDs 40 and 50 as the phase matching circuits, which are not limited to these devices as long as the phase matching functions are available. The above-mentioned pass band is in the order of approximately 1.9 GHz. However, the pass band is not limited to the above frequency order.

The present invention is not limited to the specifically described embodiments, and variations and modifications may be made without departing from the scope of the present invention.

The present invention is based on Japanese Patent Application Nos. 2004-282848 and 2005-231364 respectively filed on Sep. 28, 2004 and Aug. 9, 2005, the entire disclosure of which is hereby incorporated by reference.

What is claimed is:

1. A duplexer, comprising:
   first and second filters including film bulk acoustic resonators (FBARs) arranged in a ladder form;
   first and second integrated-passive device chips (IPDs) provided between a common terminal and the first and second filters; and
   a substrate on which the first and second filters and the first and second IPDs are mounted,
   the substrate including conductive patterns that realize inductances connected between the first and second filters and ground, and
   the first and second IPDs including respective inductors connected to the first and second filters,
   wherein the first and second IPDs include an inductor common to the first and second filters.

2. The duplexer as claimed in claim 1, wherein the first and second filters are transmit and receive filters, respectively.

3. The duplexer as claimed in claim 1, wherein:
   the first and second IPDs include phase matching circuits that establish phase matching between the first and second filters; and
   the substrate includes a multilayered substrate and the conductive patterns include patterns formed within the multilayered substrate.

4. The duplexer as claimed in claim 3, wherein the first and second filters and the first and second IPDs are facedown mounted on the substrate.

5. A duplexer comprising:
   first and second filters including film bulk acoustic resonators (FBARs) arranged in a ladder form;
   first and second phase matching circuits provided between a common terminal and the first and second filters; and
   an inductor included in at least one of the first and second phase matching circuits and connected to a ground and the common terminal,
   wherein an area of a membrane region of a series-arm resonator of one of the first and second filters that is associated with said at least one of the first and second phase matching circuits and is closest thereto is smaller than areas of membrane regions of other series-arm resonators.

6. The duplexer as claimed in claim 5, further comprising a capacitor included in said at least one of the first and second phase matching circuits and connected between the common terminal and one of the first and second filters associated with said at least one of the first and second phase matching circuits.

* * * * *